US 7,985,992 B2

United States Patent
Kang et al.

(10) Patent No.: US 7,985,992 B2
(45) Date of Patent: Jul. 26, 2011

(54) SEMICONDUCTOR DEVICE AND METHOD OF FABRICATING THE SAME

(75) Inventors: Tae-Wook Kang, Yongin (KR);
Chang-Yong Jeong, Yongin (KR);
Chang-Soo Kim, Yongin (KR);
Chang-Su Seo, Yongin (KR); Moon-Hee Park, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 39 days.

(21) Appl. No.: 12/434,048

(22) Filed: May 1, 2009

(65) Prior Publication Data

US 2009/0212295 A1    Aug. 27, 2009

Related U.S. Application Data

(62) Division of application No. 11/134,417, filed on May 23, 2005, now abandoned.

(30) Foreign Application Priority Data

May 24, 2004  (KR) .................. 10-2004-0037052
Jun. 25, 2004  (KR) .................. 10-2004-0048560

(51) Int. Cl.
*H01L 29/76*    (2006.01)

(52) U.S. Cl. ....................... 257/288; 257/774
(58) Field of Classification Search ............... 257/66, 257/288, 774
See application file for complete search history.

(56) References Cited

U.S. PATENT DOCUMENTS

| | | | | |
|---|---|---|---|---|
| 5,629,237 A | * | 5/1997 | Wang et al. | 438/701 |
| 5,940,732 A | | 8/1999 | Zhang | |
| 6,242,331 B1 | * | 6/2001 | Chu et al. | 438/586 |
| 6,458,710 B1 | * | 10/2002 | Burke | 438/713 |
| 7,118,945 B2 | | 10/2006 | Hwang et al. | |
| 7,786,553 B1 | | 8/2010 | Zhang | |
| 7,800,235 B2 | | 9/2010 | Zhang | |
| 2002/0137355 A1 | * | 9/2002 | Burke | 438/713 |
| 2003/0230748 A1 | | 12/2003 | Shih | |
| 2004/0256619 A1 | | 12/2004 | Nomura et al. | |

(Continued)

FOREIGN PATENT DOCUMENTS

CN    1049763    2/2000

(Continued)

OTHER PUBLICATIONS

Chinese Office Action dated Dec. 28, 2007.

(Continued)

*Primary Examiner* — Fernando L Toledo
(74) *Attorney, Agent, or Firm* — H.C. Park & Associates, PLC

(57) ABSTRACT

A semiconductor device and method of fabricating the same, which forms a contact hole, a via hole or a via contact hole with multiple profiles with various taper angles. The semiconductor device includes a substrate, a thin film transistor formed on the substrate and having a semiconductor layer, a gate insulating layer, a gate electrode, and an interlayer dielectric, and a contact hole penetrating the gate insulating layer and the interlayer dielectric and exposing a portion of the semiconductor layer. The contact hole has a multiple profile in which an upper portion of the contact hole has a wet etch profile and a lower portion of the contact hole has at least one of the wet etch profile and a dry etch profile.

14 Claims, 29 Drawing Sheets

U.S. PATENT DOCUMENTS

| | | |
|---|---|---|
| 2010/0047974 A1 | 2/2010 | Lim et al. |
| 2011/0001192 A1 | 1/2011 | Zhang |

FOREIGN PATENT DOCUMENTS

| | | |
|---|---|---|
| JP | 05013762 | 1/1993 |
| JP | 2001358212 | 12/2001 |
| KR | 1020020076859 | 10/2002 |

OTHER PUBLICATIONS

Non-Final Office Action dated Sep. 27, 2007 (from copending U.S. Appl. No. 11/134,417).

Non-Final Office Action dated Mar. 24, 2008 (from copending U.S. Appl. No. 11/134,417).

Final Office Action dated Nov. 4, 2008 (from copending U.S. Appl. No. 11/134,417).

Advisory Action dated Mar. 6, 2009 (from copending U.S. Appl. No. 11/134,417).

Non-Final Office Action of Oct. 4, 2010 in U.S. Appl. No. 12/434,072.

Non-final Office Action of U.S. Appl. No. 12/434,072 issued on Mar. 30, 2011.

* cited by examiner

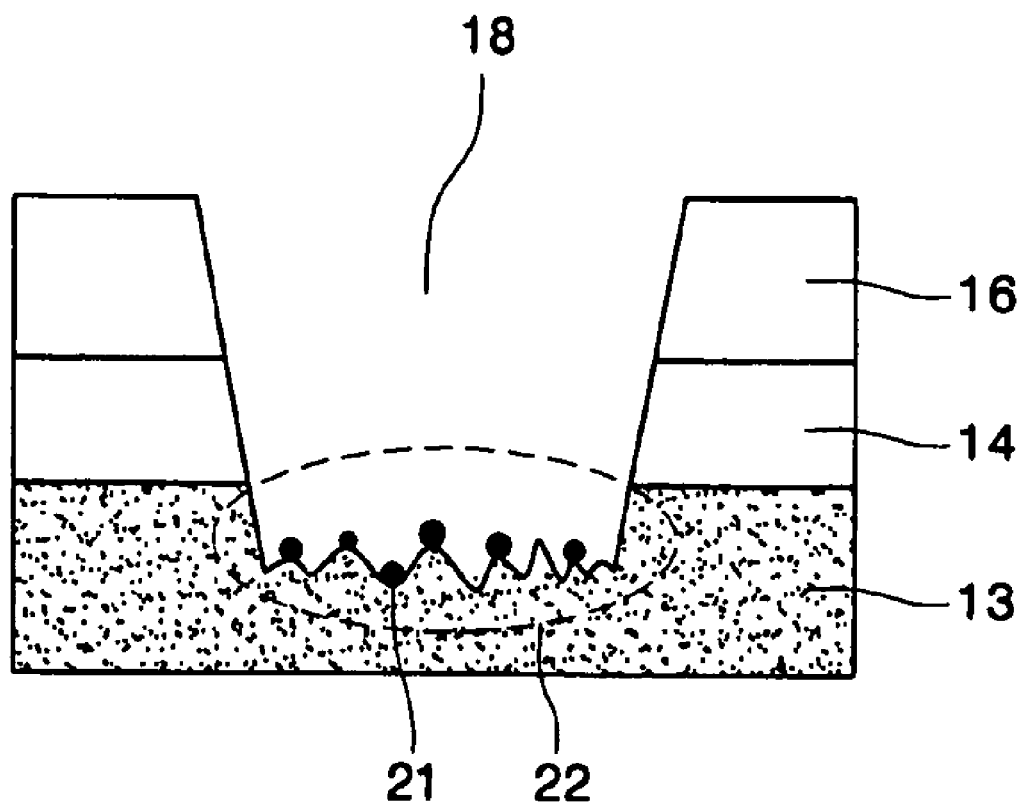

SEMICONDUCTOR DEVICE AND METHOD OF FABRICATING THE SAME

CROSS-REFERENCE TO RELATED APPLICATION

This application is a divisional of prior application Ser. No. 11/134,417, filed May 23, 2005, and claims priority to and the benefit of Korean Patent Application No. 10-2004-0037052, filed May 24, 2004, and Korean Patent Application No. 10-2004-0048560, filed Jun. 25, 2004, which are all hereby incorporated by reference for all purposes as if fully set forth herein.

BACKGROUND OF THE INVENTION

1. Field of the Invention

The present invention relates to a semiconductor device and method of fabricating the same and, more particularly, to a semiconductor device and method of fabricating the same, wherein a contact hole, a via hole and a via contact hole have multiple profiles with various taper angles.

2. Discussion of the Background

Generally, thin film transistors (TFT) are utilized in flat panel displays, image sensors, copiers, printers, scanners, and so forth.

Examples of a flat panel display include a Liquid Crystal Display (LCD), an organic electro-luminescence (EL) device, etc. A representative technology of the flat panel display is the organic EL device, which is may be classified into an active matrix (AM) organic EL device and a passive matrix (PM) organic EL device. An active device such as a TFT controls each pixel in the AM organic EL device. Hence, the AM organic EL device may be superior to the PM organic EL device in terms of speed, viewing angle, and contrast ratio, and it may have a very high resolution.

Silicon TFTs are often used for organic EL devices because they may be fabricated at a low temperature of 400° C. or less, stability of the device characteristics may be excellent, and they may be easily integrated on a large-area glass substrate.

FIG. 1A and FIG. 1B are cross-sectional views showing a conventional method of fabricating a contact hole of a TFT.

FIG. 1A is a cross-sectional view showing a process of forming a buffer layer, a semiconductor layer, a gate insulating layer, a gate electrode, and an interlayer dielectric on a substrate. As shown in FIG. 1A, a silicon oxide or silicon nitride buffer layer 12 may be formed on an insulating substrate 11 such as plastic or glass, and then an amorphous silicon layer is formed thereon. The amorphous silicon layer may be crystallized to form a polycrystalline silicon layer, which is then patterned to form a semiconductor layer 13. A gate insulating layer 14 may be formed on the entire surface of the substrate, and a material for forming a gate electrode is deposited and patterned to form the gate electrode 15. An interlayer dielectric 16, which protects or insulates elements therebelow and may be made of a silicon oxide layer or a silicon nitride layer, may be formed on the entire surface of the substrate.

FIG. 1B is a cross-sectional view showing a process of forming the contact hole using a photoresist pattern on the substrate. As FIG. 1B shows, a photoresist pattern 17 may be formed and the photoresist is dry etched using the photoresist pattern as a mask to form a contact hole 18. The photoresist pattern 17 is then removed, the contact hole 18 may be filled with a conductive material, and source and drain electrodes (not shown) are formed on the interlayer dielectric 16.

However, in the above-mentioned method of forming the contact hole, as FIG. 2 shows, the dry etching may cause a polymer 21 to be formed below the contact hole 18, which penetrates the interlayer dielectric 17 and the gate insulating layer 14 and exposes a surface of the semiconductor layer 13. Hence, a specific polymer removal solution may be required to remove the polymer 21, which adds an additional process. Further, the surface of the semiconductor layer 13 may be damaged by over etching 22, thereby making contact resistance non-uniform.

SUMMARY OF THE INVENTION

The present invention provides a semiconductor device and method of fabricating the same, which performs dry etching employing at least one of high etch rate dry etching and high selectivity dry etching and performs wet etching in a final etching process when forming a contact hole of a semiconductor layer and source and drain electrodes, a via hole of a positive electrode and source and drain electrodes, a via hole between metal interconnection lines, or a via contact hole. Consequently, the contact hole, the via hole or the via contact hole may have multiple profiles with various taper angles, and an etch residue caused by etching may be completely removed during wet etching.

Additional features of the invention will be set forth in the description which follows, and in part will be apparent from the description, or may be learned by practice of the invention.

The present invention discloses a semiconductor device including a substrate, a thin film transistor formed on the substrate and having a semiconductor layer, a gate insulating layer, a gate electrode, and an interlayer dielectric, and a contact hole penetrating the gate insulating layer and the interlayer dielectric and exposing a portion of the semiconductor layer. The contact hole has a multiple profile in which an upper portion of the contact hole has a wet etch profile and a lower portion of the contact hole has at least one of a wet etch profile and a dry etch profile.

The present invention also discloses a method of fabricating a semiconductor device including forming a semiconductor layer, a gate insulating layer, a gate electrode, and an interlayer dielectric on a substrate, performing at least one of a dry etching process and a wet etching process on a portion of the interlayer dielectric and the gate insulating layer to form a contact hole to a predetermined depth, and wet etching the contact hole to complete the contact hole and expose a portion of the semiconductor layer.

The present invention also discloses a semiconductor device including a substrate, a thin film transistor (TFT) formed on the substrate and having a source electrode and a drain electrode, a passivation layer and a planarization layer formed on the TFT, and a via hole penetrating the passivation layer and the planarization layer and exposing a portion of either the source electrode or the drain electrode. The via hole has a multiple profile in which an upper portion of the via hole has a wet etch profile and a lower portion has at least one of a wet etch profile and a dry etch profile.

The present invention also discloses a method of fabricating a semiconductor device including forming a thin film transistor (TFT) including source and drain electrodes on a substrate, forming a passivation layer and a planarization layer on the TFT, performing at least one of a dry etching process and a wet etching process on a portion of the passivation layer and the planarization layer to form a via hole with a predetermined depth, and wet etching the via hole to complete the via hole and expose a portion of either the source or drain electrode.

The present invention also discloses a semiconductor device including a substrate, a metal interconnection line formed on the substrate, an interlayer dielectric layer formed on the metal interconnection line, and a via hole penetrating the interlayer dielectric and exposing a portion of the metal interconnection line. The via hole has a multiple profile in which an upper portion of the via hole has a wet etch profile and a lower portion has at least one of a wet etch profile and a dry etch profile.

The present invention also discloses a method of fabricating a semiconductor device including forming a metal interconnection line and an interlayer dielectric on a substrate, performing at least one of a dry etching process and a wet etching process on a portion of the interlayer dielectric to form a via hole to a predetermined depth, and wet etching the via hole to complete the via hole and expose a portion of the metal interconnection line.

The present invention also discloses a semiconductor device including a substrate, a semiconductor layer, a gate insulating layer, and a gate electrode formed on the substrate, a planarization layer formed on the substrate, and a via contact hole penetrating the planarization layer and the gate insulating layer and exposing a portion of the semiconductor layer. The via contact hole has a multiple profile in which an upper portion of the via contact hole has a wet etch profile and a lower portion has at least one of a wet etch profile and a dry etch profile.

The present invention also discloses a method of fabricating a semiconductor device including forming a semiconductor layer, a gate insulating layer, and a gate electrode on a substrate, forming a planarization layer on the substrate, performing at least one of a dry etching process and a wet etching process on a portion of the gate insulating layer and the planarization layer to form a via contact hole to a predetermined depth, and wet etching the via contact hole to complete the via contact hole and expose a portion of the semiconductor layer.

The present invention also discloses a semiconductor device including a substrate; a semiconductor layer, a gate insulating layer, a gate electrode, and an interlayer dielectric formed on the substrate; and a thin film transistor (TFT) region including a contact hole, the contact hole penetrating the gate insulating layer and the interlayer dielectric, exposing a portion of the semiconductor layer, and having a multiple profile in which an upper portion of the contact hole has a wet etch profile and a lower portion of the contact hole has at least one of a wet etch profile and a dry etch profile. A metal interconnection line and an insulating layer are formed on the substrate and spaced apart from the TFT region by a predetermined interval, and a via hole penetrates the insulating layer and has a multiple profile in which an upper portion of the via hole has a wet etch profile and a lower portion of the via hole has at least one of a wet etch profile and a dry etch profile.

The present invention also discloses a method of fabricating a semiconductor device including forming a semiconductor layer, a gate insulating layer, and a gate electrode in a thin film transistor (TFT) region of a substrate, and forming a metal interconnection line in a metal interconnection line region spaced apart from the TFT region by a predetermined interval. An interlayer dielectric is formed in the TFT region, and an insulating layer is formed in the metal interconnection line region. At least one of a dry etching process and a wet etching process is performed on a portion of the insulating layer in the metal interconnection line region, and on the interlayer dielectric and the gate insulating layer in the TFT region, to form a contact hole and a via hole each having a predetermined depth. The contact hole and the via hole are wet etched to complete the contact hole and the via hole and expose a portion of the semiconductor layer in the TFT region and a portion of the metal interconnection line in the metal interconnection line region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIG. 2 is a cross-sectional view showing a problem that may be associated with a conventional contact hole.

DETAILED DESCRIPTION OF THE ILLUSTRATED EMBODIMENTS

The present invention will be described below with reference to the accompanying drawings showing exemplary embodiments of the invention.

First Embodiment

FIG. 3A, FIG. 3B, FIG. 3C, FIG. 3D and FIG. 3E are cross-sectional views showing a method of forming a contact hole and a device having the contact hole in accordance with embodiments of the present invention.

Figure 1A:
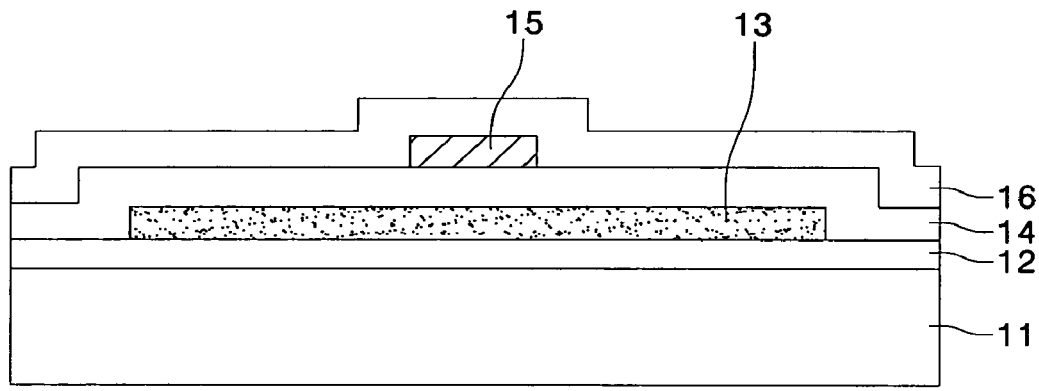
FIG. 1A and FIG. 1B are cross-sectional views showing a conventional method of forming a contact hole of a TFT.
Figure 1B:
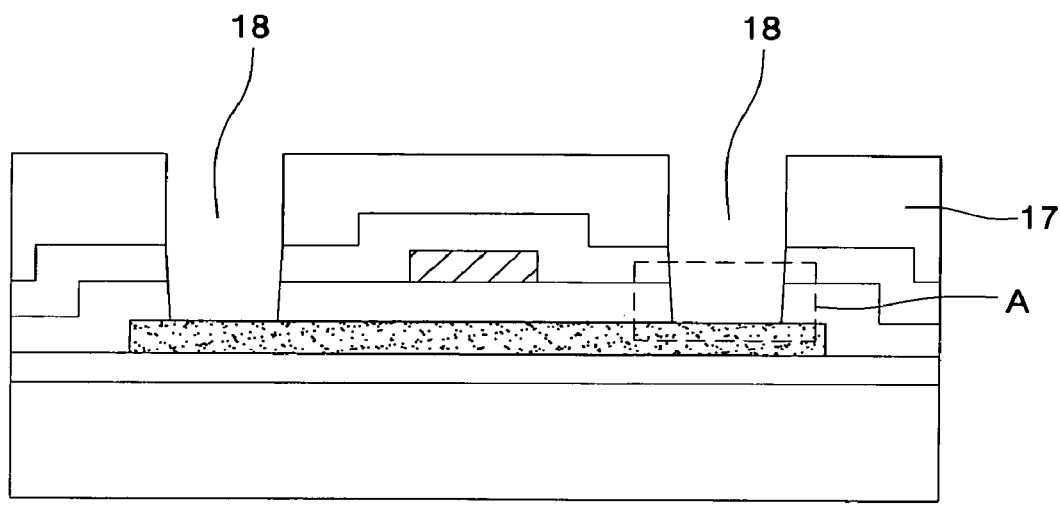
Figure 3A:
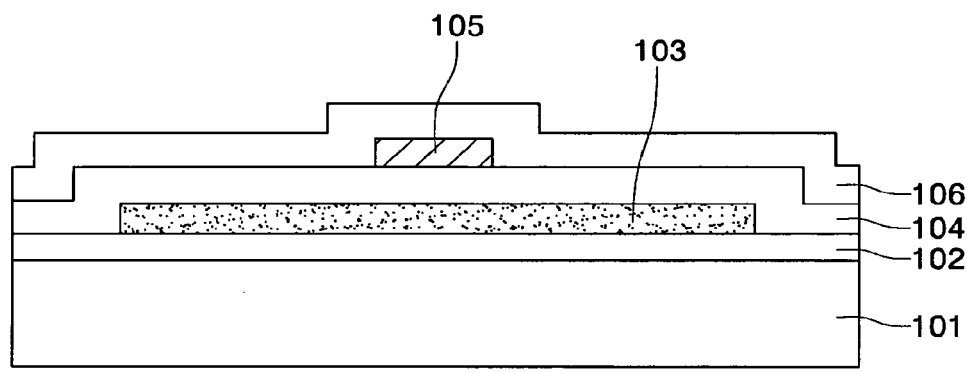
FIG. 3A, FIG. 3B, FIG. 3C, FIG. 3D and FIG. 3E are cross-sectional views showing a method of forming a contact hole and a device having the contact hole in accordance with embodiments of the present invention.

First, FIG. 3A is a cross-sectional view showing a process of forming a buffer layer, a semiconductor layer, a gate insulating layer, a gate electrode, and an interlayer dielectric on a substrate. As FIG. 3A shows, a buffer layer 102 may be formed on an insulating substrate 101, which may be made of a material such as, for example, plastic or glass. The buffer layer 102 may prevent moisture or impurities from the insulating substrate from diffusing, and it may facilitate crystallization of the semiconductor layer by adjusting a heat transfer speed during crystallization.

Next, an amorphous silicon layer may be formed on the buffer layer 102, crystallized to be a polycrystalline silicon layer or a single crystalline silicon layer, and then patterned to form a semiconductor layer 103. A chemical vapor deposition (CVD) method or a physical vapor deposition (PVD) method, for example, may be used to form the amorphous silicon layer. Additionally, the amorphous silicon layer may be dehydrated to reduce the presence of hydrogen during or after the layer's formation.

Next, a gate insulating layer 104 may be formed on the entire surface of the substrate including the semiconductor layer 103, and a material for forming a gate electrode may then be formed on the gate insulating layer 104 and patterned to form a gate electrode 105. After forming the gate electrode 105, impurity ions may be implanted in the semiconductor layer 103, using the gate electrode as a mask, thereby defining source, drain, and channel regions in the semiconductor layer 103.

An interlayer dielectric 106, which protects or electrically insulates elements formed therebelow from each other, may then be formed on the entire surface of the substrate.

In this case, the buffer layer 102, the gate insulating layer 104, and the interlayer dielectric 106 may be formed of, for example, an oxide layer such as a silicon oxide layer or a nitride layer such as a silicon nitride layer.

Figure 3B:
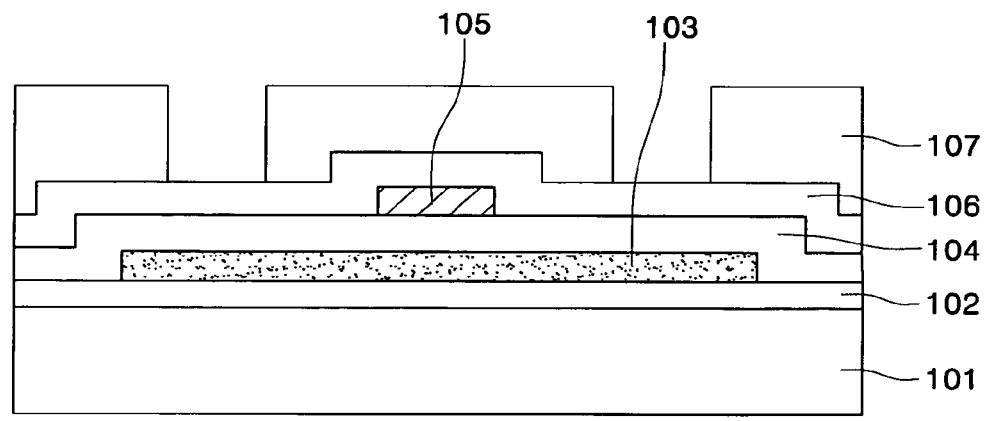

Next, FIG. 3B is a cross-sectional view showing the step of forming a photoresist pattern for forming a contact hole on the substrate. As FIG. 3B shows, a photoresist pattern 107 for forming the contact hole may be formed on the substrate including the buffer layer 102, the semiconductor layer 103, the gate insulating layer 104, the gate electrode 105, and the interlayer dielectric 106.

The photoresist pattern 107 may be formed by coating a photoresist on the substrate using a spin method or a spray method. Subsequent exposure and development processes are then carried out.

Figure 3C:
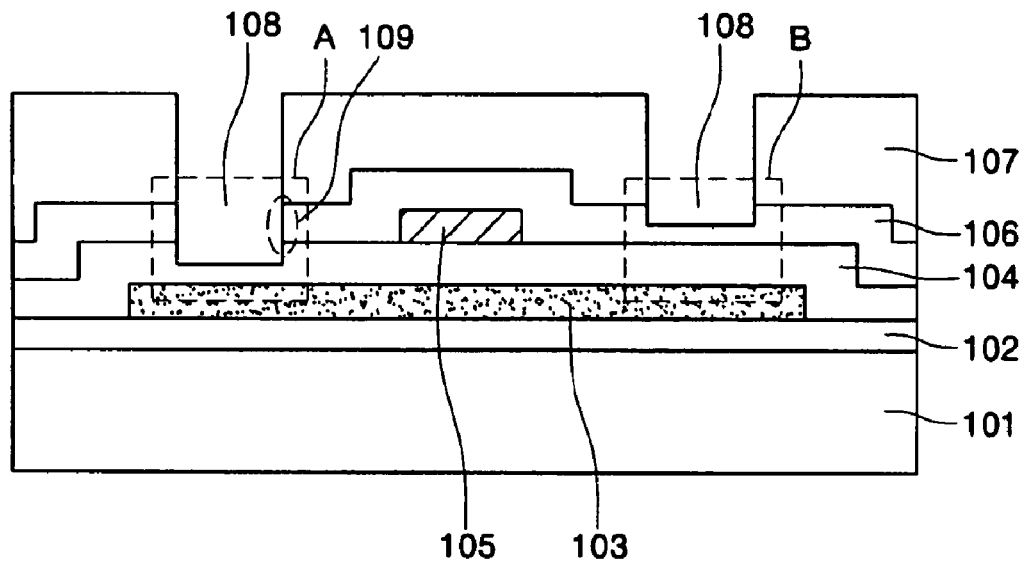

Next, FIG. 3C is a cross-sectional view showing the step of forming a contact hole with a predetermined depth by dry etching a portion of the interlayer dielectric and the gate insulating layer by means of the photoresist pattern. As FIG. 3C shows, the interlayer dielectric 106 and the gate insulating layer 104 may be dry etched using the photoresist pattern 107 as a mask to thereby form a contact hole 108 with a predetermined depth.

In this case, as shown in regions A and B of FIG. 3C, respectively, the interlayer dielectric 106 may be penetrated and a portion of the gate insulating layer 104 may be etched, or a portion of the interlayer dielectric 106 may be etched. Alternatively, although not shown, the interlayer dielectric 106 may be penetrated without etching the gate insulating layer 104. In other words, the contact hole 108 may be formed by the dry etching process to have a desired depth so that the semiconductor layer 103 is not damaged by the dry etching process, the semiconductor layer 103 is not exposed, thereby preventing residues such as a polymer from attaching thereto, and the contact hole 108 may have a profile in a desired shape.

Additionally, when dry etching, the interlayer dielectric 106 and the gate insulating layer 104 may be etched at a high etch rate to adjust the taper angle 109 and depth of the contact hole 108, and the contact hole may be dry etched to have an angle almost perpendicular to formed layers. In this case, the taper angle 109 of the contact hole 108 may be in a range of about 60° to about 90°, preferably in a range of about 75° to about 90°.

In this case, an ion etching process such as, for example, an ion beam etching process and a radio frequency (RF) sputter etching process, or a reactive etching process such as, for example, a reactive ion etching process may be utilized for the dry etching.

Figure 3D:
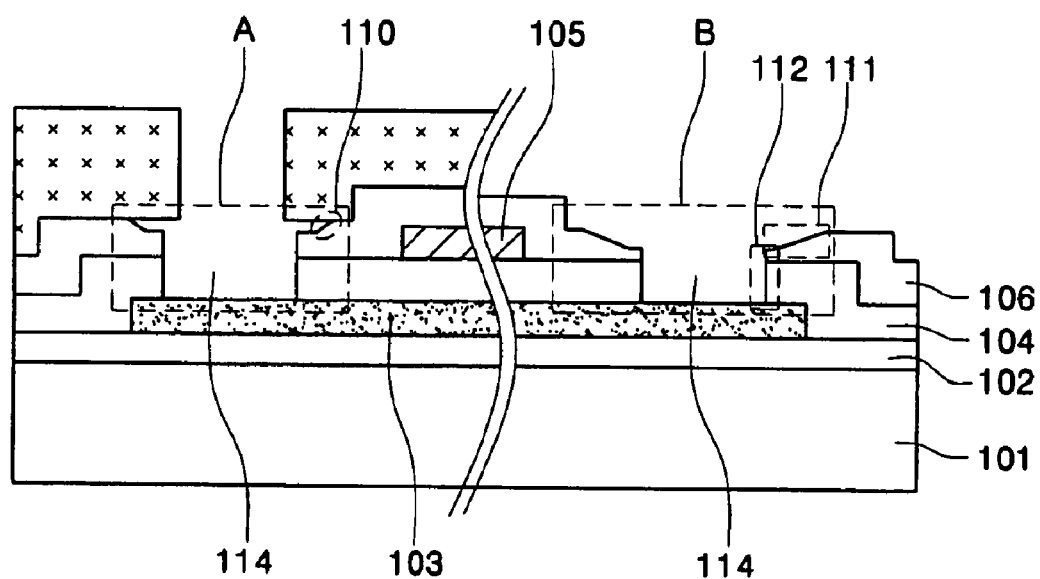

Next, FIG. 3D is a cross-sectional view showing the step of wet etching the contact hole formed to a predetermined depth to expose the surface of the semiconductor layer, thereby completing the contact hole. As FIG. 3D shows, the dry etched contact hole 108 is wet etched to expose the surface of the semiconductor layer 103.

In this case, as shown in region A of FIG. 3D, a photoresist pattern may not be removed, the contact hole 108 formed by the dry etching may be wet etched to expose the surface of the semiconductor layer, and a low taper angle 110 of the contact hole 114 may be formed by isotropic wet etching. Alternatively, as shown in region B of FIG. 3D, a photoresist pattern may be removed and a small taper angle of the contact hole may be formed using isotropic wet etching. When wet etching after removing the photoresist pattern, the surface of the interlayer dielectric 106 is etched, which may reduce the thickness of the interlayer dielectric 106. This does not pose a problem, however, when the interlayer dielectric 106 is appropriately formed considering this consequence.

In this case, the taper angle 110 of the contact hole 114 formed by wet etching may have a range of about 5° to about 60°, preferably a range of about 5° to about 45°. Additionally, the wet etching may be carried out such that the interlayer dielectric 106 and the gate insulating layer 104 are wet etched using an etching solution having high selectivity against etching the semiconductor layer 103, so that the semiconductor layer 103 may not be damaged by the wet etching solution, even when the surface of the semiconductor layer is exposed or already exposed, and polymer residues thereon may also be removed.

Accordingly, a double profile contact hole 114 is formed such that an upper portion of the contact hole 114 has a profile 111 formed by wet etching and a lower portion of the contact hole 114 has a profile 112 formed by dry etching.

Figure 3E:
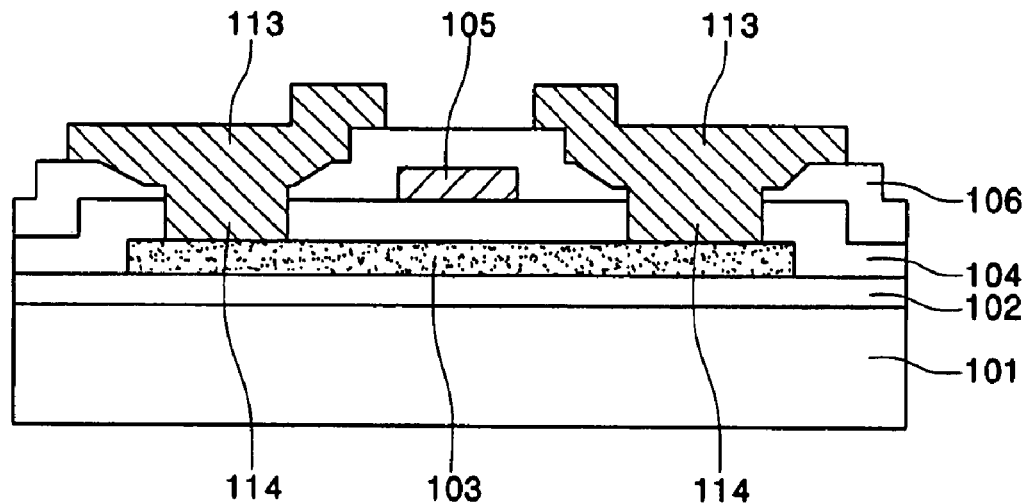

FIG. 3E is a cross-sectional view showing a process of forming a TFT having the above-mentioned double profile contact hole. As FIG. 3E shows, a material for forming source and drain electrodes may be deposited on the entire surface of the substrate having the contact hole 114 and then patterned to form source and drain electrodes 113, thereby completing the TFT. Consequently, the contact hole 114 between the source and drain electrodes 113 and the semiconductor layer 103 has an upper portion with a wet etch profile and a lower portion with a dry etch profile. Therefore, polymer residues may be removed so that they do not cause any contact resistance, and the surface of the semiconductor layer 103 may not be damaged during etching. Further, the contact hole's double profile facilitates filling the contact hole with the material for forming the source and drain electrodes.

Second Embodiment

FIG. 4A, FIG. 4B, FIG. 4C, FIG. 4D, FIG. 4E, FIG. 4F and FIG. 4G are cross-sectional views showing a method of forming a contact hole, and cross-sectional views and a cross-sectional photograph of a device having the contact hole in accordance with embodiments of the present invention.

Figure 4A:
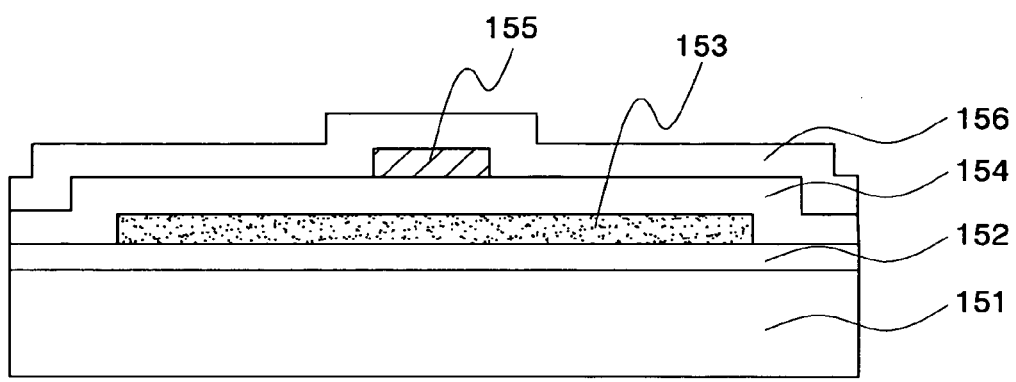
FIG. 4A, FIG. 4B, FIG. 4C, FIG. 4D, FIG. 4E, FIG. 4F and FIG. 4G are cross-sectional views showing a method of forming a contact hole, and cross-sectional views and a cross-sectional photograph of a device having the contact hole in accordance with embodiments of the present invention.

First, FIG. 4A is a cross-sectional view showing the step of forming a buffer layer, a semiconductor layer, a gate insulating layer, a gate electrode, and an interlayer dielectric on a substrate. As FIG. 4A shows, a buffer layer 152 may be formed on an insulating substrate 151, which may be made of a material such as, for example, plastic or glass. The buffer layer 152 may prevent moisture or impurities from the insulating substrate 151 from diffusing, and it may facilitate crystallization of the semiconductor layer by adjusting a heat transfer speed during crystallization.

Next, an amorphous silicon layer may be formed on the buffer layer 152, crystallized to form a polycrystalline silicon layer or a single crystalline silicon layer, and then patterned to form a semiconductor layer 153. In this case, a CVD method or a PVD method, for example, may be used to form the amorphous silicon layer. Additionally, the amorphous silicon layer may be dehydrated to reduce the presence of hydrogen during or after the layer's formation.

Next, a gate insulating layer 154 may be formed on the entire surface of the substrate having the semiconductor layer 153, and a material for forming a gate electrode may be formed on the gate insulating layer 154 and patterned to form a gate electrode 155. After forming the gate electrode 155, impurity ions may be implanted in the semiconductor layer 153, using the gate electrode 155 as a mask, thereby defining source, drain, and channel regions in the semiconductor layer 153.

Next, an interlayer dielectric 156, which may protect or electrically insulate elements formed therebelow from each other, may then be formed on the entire surface of the substrate.

In this case, the buffer layer 152, the gate insulating layer 154, and the interlayer dielectric 156 may be formed of an oxide layer such as, for example, a silicon oxide layer or a nitride layer such as, for example, a silicon nitride layer.

The buffer layer 152 may be omitted under appropriate circumstances.

Figure 4B:
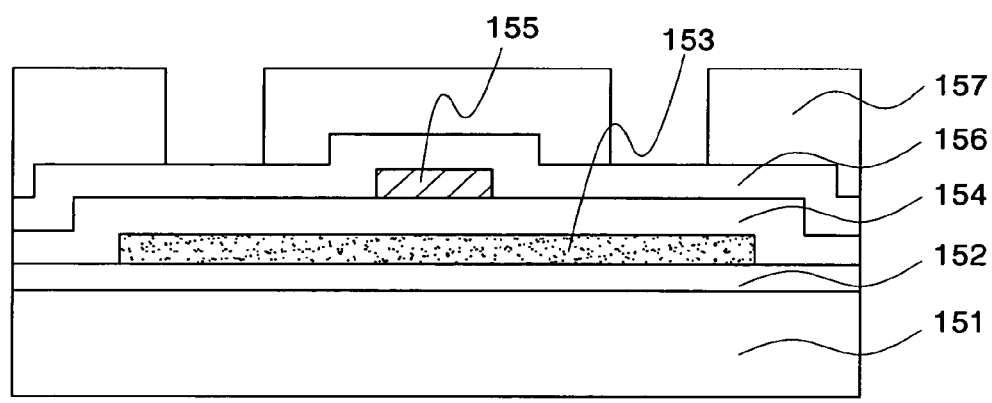

Next, FIG. 4B is a cross-sectional view showing the step of forming a photoresist pattern for forming a contact hole on the substrate. As FIG. 4B shows, a photoresist pattern 157 for forming the contact hole may be formed on the substrate including the buffer layer 152, the semiconductor layer 153, the gate insulating layer 154, the gate electrode 155, and the interlayer dielectric 156.

The photoresist pattern 157 may be formed by coating a photoresist on the substrate using a spin method or a spray method. Subsequent exposure and development processes are then carried out.

Figure 4C:
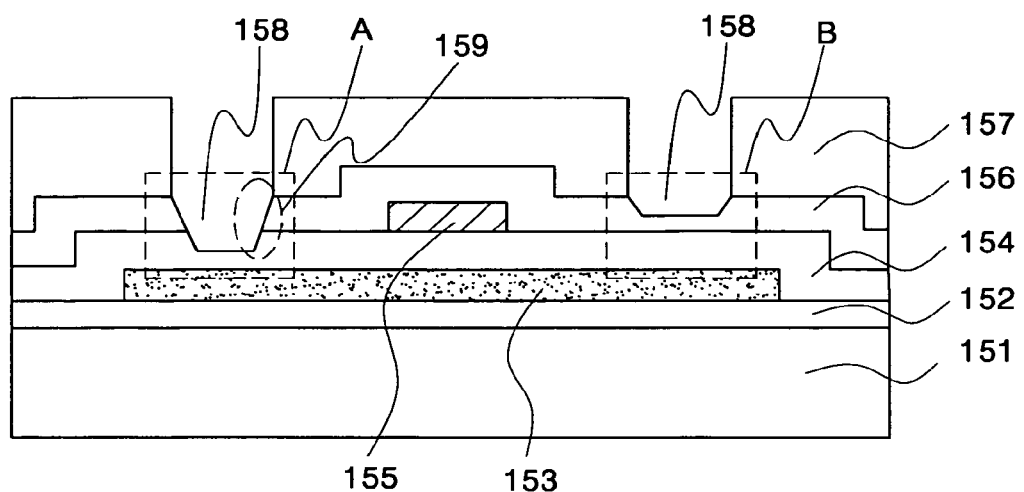

Next, FIG. 4C is a cross-sectional view showing the step of dry etching a portion of the interlayer dielectric and the gate insulating layer at a high etch rate to have a first depth. As FIG. 4C shows, the interlayer dielectric 156 and the gate insulating layer 154 may be dry etched at a high etch rate using the photoresist pattern 157 as a mask to thereby form a first contact hole 158 to a first depth.

In this case, as shown in regions A and B of FIG. 4C, respectively, the interlayer dielectric 156 may be penetrated and a portion of the gate insulating layer 154 may be etched, or a portion of the interlayer dielectric 156 may be etched. Alternatively, although not shown, the interlayer dielectric 156 may be penetrated without etching the gate insulating layer 154. In other words, the contact hole 158 may be formed by high etch rate dry etching to have a desired depth so that the semiconductor layer 153 is not damaged by the dry etching process, the semiconductor layer 153 is not exposed, thereby preventing residues such as a polymer from attaching thereto, and the contact hole 158 may have a profile in a desired shape.

Additionally, the interlayer dielectric 156 and the gate insulating layer 154 may be dry etched at a fast speed because of the high etch rate. In this case, a taper angle 159 of the first contact hole 158 may be in a range of about 30° to about 70°, preferably in a range of about 30° to about 50°.

In this case, an ion etching process such as, for example, an ion beam etching process and a RF sputter etching process, or a reactive etching process such as, for example, a reactive ion etching process and an induced coupled plasma etching process, may be used for the high etch rate dry etching.

Figure 4D:
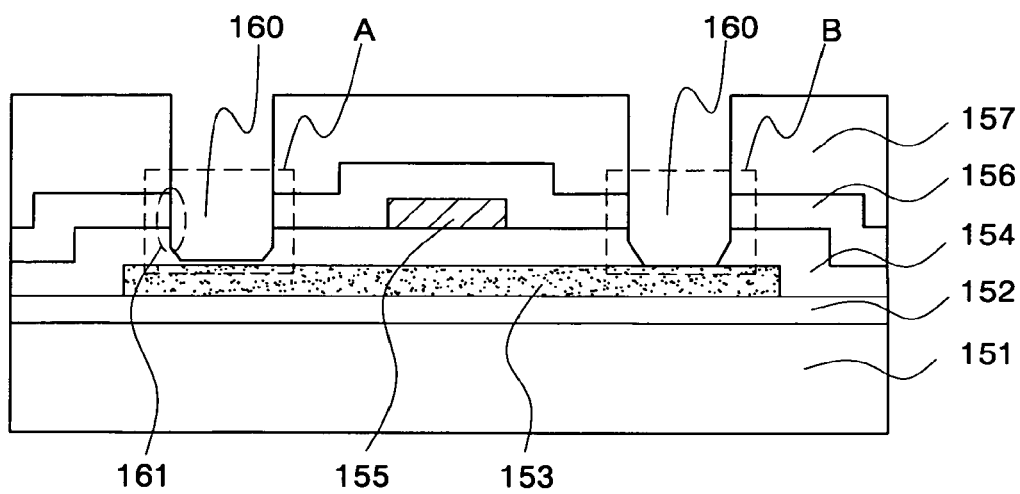

Next, FIG. 4D is a cross-sectional view showing the step of dry etching the gate insulating layer and the interlayer dielectric etched to the first depth with high selectivity against etching the semiconductor layer to thereby have a second depth. As FIG. 4D shows, the gate insulating layer 154 and the interlayer dielectric 156 of the first contact hole 158 having the first depth etched at a high etch rate dry etching may be etched by high selectivity etching against etching the semiconductor layer 153 to thereby form a second contact hole 160 having the second depth. In this case, the profile of the first contact hole 158 may be maintained in the lower portion of the second contact hole 160, which results from the fact that the etching speed in the high selectivity etching is slow while an etch for etching the gate insulating layer 154 and the interlayer dielectric 156 is high.

In this case, the high selectivity dry etching means that the etch rate for the gate insulating layer 154 and the interlayer dielectric 156 is high, and the etch rate for the semiconductor layer 153 is low. Consequently, the gate insulating layer 154 and the interlayer dielectric 156 are etched by high selectivity dry etching while the semiconductor layer 153 is minimally etched, and a taper angle 161 of the second contact hole 160 may have a profile nearly perpendicular to adjacent layers because the photoresist pattern is not much recessed, and the taper angle may be higher than that of the first contact hole having the first depth. In other words, the taper angle 161 of the second contact hole 160 having the second depth formed by high selectivity dry etching may be in a range of about 60° to about 90°. In this case, the taper angle 161 is preferably in a range of about 70° to about 90°.

The second contact hole 160 having the second depth may be formed to a depth where it does not expose the semiconductor layer 153, as shown in region A of FIG. 4D, or it may be formed to a depth where it exposes the semiconductor layer 153, as shown in region B of FIG. 4D. This is possible because the high selectivity dry etching etches the gate insulating layer 154 and the interlayer dielectric 156, but it may minimally etch the semiconductor layer 153, which may minimize damage to the surface of the semiconductor layer 153. However, since high selectivity dry etching may affect the semiconductor layer 153, the gate insulating layer 154 may be etched to the depth where the semiconductor layer 153 is not exposed, as shown in region A, thereby preventing the semiconductor layer from being damaged or over-etched.

In this case, for example, an ion beam etching process such as the high etch rate dry etching process, an ion etching process such as an RF sputter etching process, or a reactive etching process such as a reactive ion etching process and an induced coupled plasma etching process may be used for the high selectivity dry etching process. Additionally, $CF_4/O_2$ or $SF_6/O_2$ gas may be used for high etch rate dry etching, and $C_4F_8$, $CHF_3$, or $C_2HF_5$ gas, which has a high CF ratio, may be used for high selectivity dry etching.

Figure 4E:
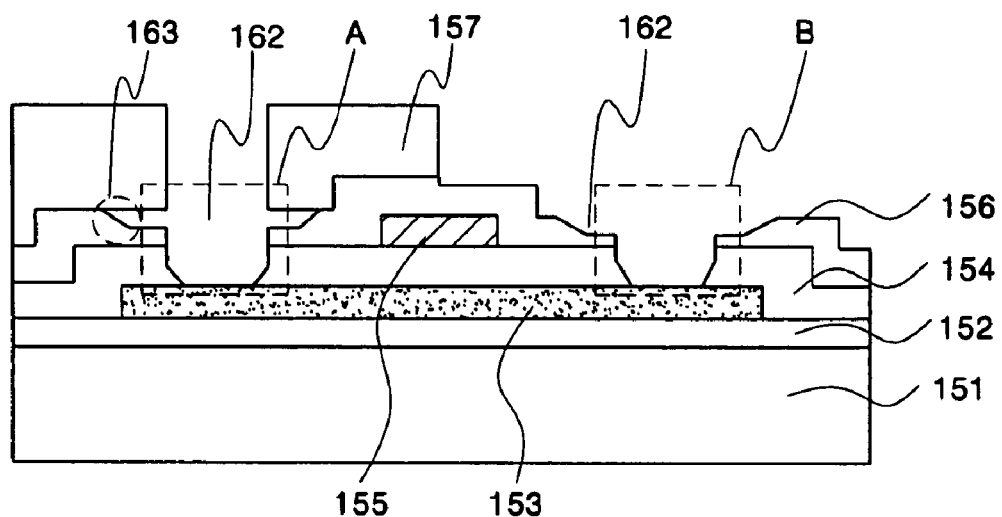

Next, FIG. 4E is a cross-sectional view showing the step of wet etching the region etched to the second depth to form a third contact hole. As FIG. 4E shows, the first and second contact holes 158 and 160 formed by high etch rate dry etching and high selectivity dry etching, respectively, may be wet etched to form a third contact hole 162, which completes the contact hole. The wet etching may use a wet etching solution such as, for example, a dilute hydrofluoric acid (DHF) or a buffered hydroFluoric acid (BHF), which may not etch the semiconductor layer 153. The surface of the semiconductor layer 153 and sides of the contact holes are etched using the etching solution to remove impurities or polymer residues thereon, so that there are no impurities on the semiconductor layer 153.

In this case, as shown in region A of FIG. 4E, the photoresist pattern 157 may not be removed, the first and second contact holes 158 and 160 formed by high etch rate dry etching and high selectivity dry etching may be wet etched to expose the surface of the semiconductor layer 153 (or each width of the first and second contact holes increases if the surface is already exposed), and a low taper angle 163 of the third contact hole 162 may be formed by isotropic wet etching. Alternatively, as shown in region B of FIG. 4E, the photoresist pattern 157 may be removed and a small taper angle of the third contact hole 162 may be formed by isotropic wet etching. When wet etching after removing the photoresist pattern, the surface of the interlayer dielectric 156 is etched, which may reduce the thickness of the interlayer dielectric 156. This does not pose a problem, however, when the interlayer dielectric 156 is formed considering this consequence.

In this case, the taper angle 163 of the third contact hole formed by wet etching may be in a range of about 5° to about 50°, preferably in a range of about 5° to about 35°. Additionally, the wet etching may be carried out such that the interlayer dielectric 156 and the gate insulating layer 154 may be wet etched with an etching solution having high selectivity against etching the semiconductor layer 153, so that the semiconductor layer 153 may not be damaged by the wet etching solution, even when the surface of the semiconductor layer is exposed or already exposed, and polymer residues thereon may also be removed.

As a result, a triple profile contact hole including the first, second, and third contact holes 158, 160 and 162 is completed, where an upper portion of the triple profile contact hole has a wet etch profile, its middle portion has a high selectivity dry etch profile having a high taper angle, and its lower portion has a high etch rate dry etch profile having a low taper angle.

Figure 4F:
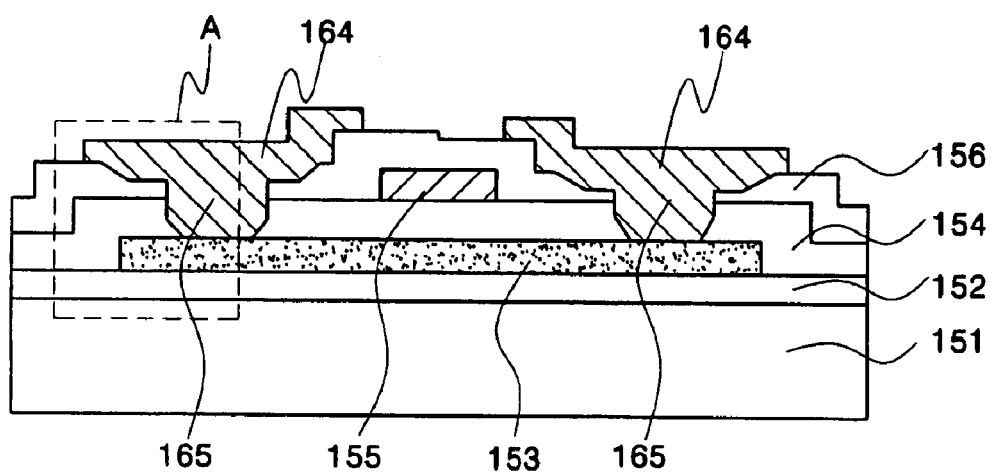

Next, FIG. 4F is a cross-sectional view showing a process of forming a TFT having the above-mentioned triple profile contact hole. As FIG. 4F shows, a material for forming source and drain electrodes may be deposited on the entire surface of the substrate including the triple profile contact hole 165, and then patterned to form source and drain electrodes 164, thereby completing the TFT. Consequently, the triple profile contact hole 165 between the source and drain electrodes 164 and the semiconductor layer 153 has an upper portion with a wet etch profile, a middle portion with a high selectivity dry etch profile with a high taper angle, and a lower portion with a high etch rate dry etch profile with a low taper angle. Therefore, contact resistance due to polymer residues may be minimized since the residues may be removed, and the surface of the semiconductor layer 153 may not be damaged during etching. Further, the contact hole's triple profile facilitates filling the contact hole with the material for forming the source and drain electrodes, and natural oxide layers that may occur during the process may be removed by the wet etching, which reduces the contact resistance due to the natural oxide layers.

Figure 4G:
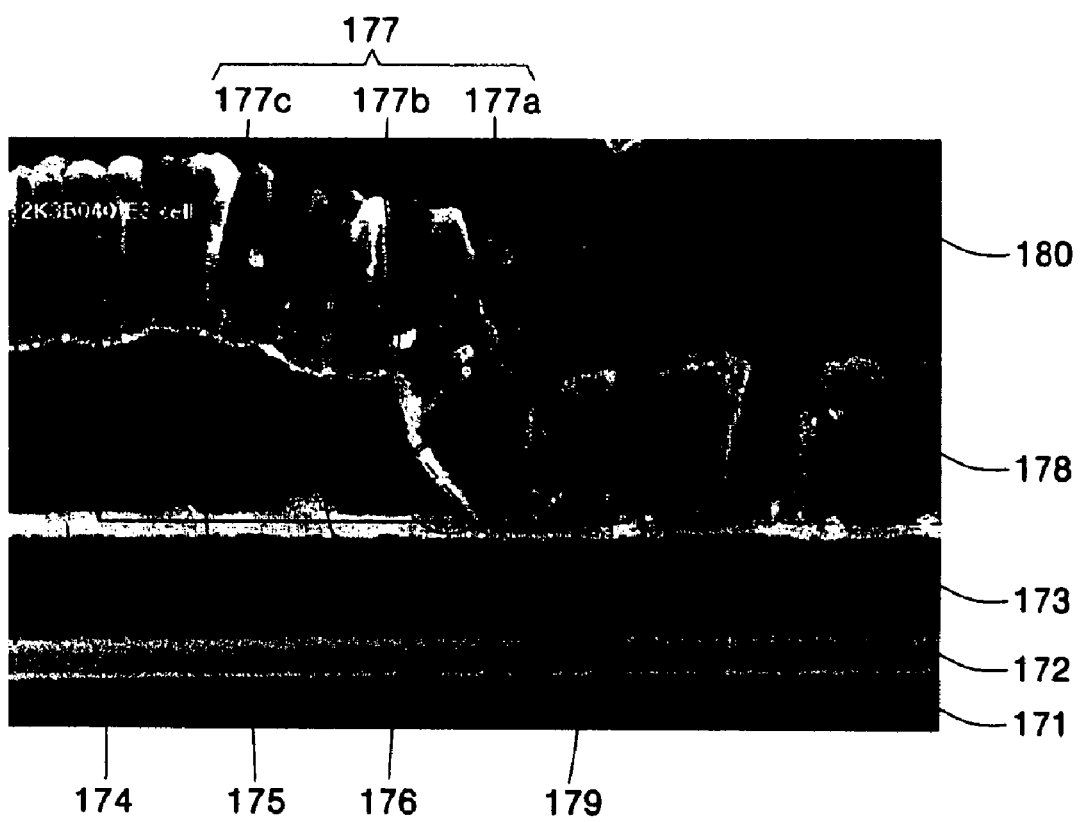

Next, FIG. 4G is a cross-sectional photograph showing a source/drain electrode formed using the triple profile contact hole. Referring to FIG. 4G, which is an enlarged photograph of region A of FIG. 4F, a first buffer layer 172 and a second buffer layer 173 are formed of an oxide or nitride layer on a glass substrate 171, and a semiconductor layer 174 is formed on the second buffer layer 173.

Next, a gate insulating layer 175 is formed on the semiconductor layer 174, a gate electrode, which is not shown in the photograph, and an interlayer dielectric 176 are sequentially formed.

The interlayer dielectric 176 and the gate insulating layer 175 were etched by high etch rate dry etching, high selectivity dry etching, and wet etching, as described in the second embodiment of the present invention, to thereby form a triple profile contact hole 177 and a source/drain electrode 178. Here, the dotted line 179 denotes the triple profile shape.

Next, a passivation layer 180 is formed on the entire surface of the substrate, and a subsequent process may be carried out to form an organic light emitting device, which may be used to form a display device.

In this case, since the source and drain electrodes are formed in the triple profile contact hole including a first contact hole 177a having a high etch rate dry etch profile, a second contact hole 177b having a high selectivity dry etch profile, and a third contact hole 177c having a wet etch profile, the photograph shows that the source and drain electrodes may be gently formed by the triple profile contact hole having gentle step coverage. Additionally, a first depth 181a of the first contact hole 177a, a second depth 181b of the second contact hole 177b, and a third depth 181c of the third contact hole 177c may be adjusted to readily adjust the step coverage of the triple profile contact hole. The third depth 181c may be obtained by subtracting the first and second depths from the depth of the contact hole.

Third Embodiment

FIG. 5A, FIG. 5B, FIG. 5C, FIG. 5D and FIG. 5E are cross-sectional views showing a method of forming a via hole and a device having the via hole in accordance with embodiments of the present invention.

Figure 5A:
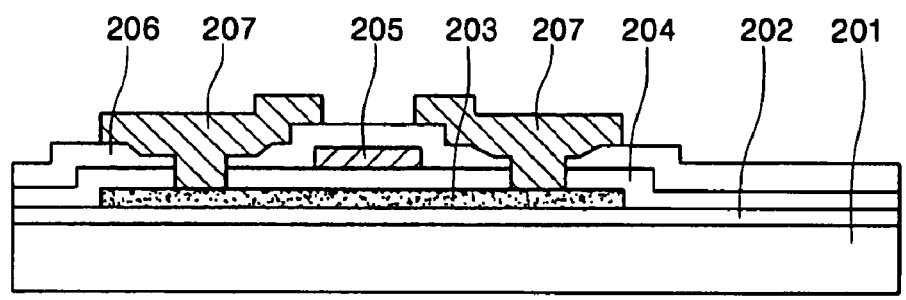
FIG. 5A, FIG. 5B, FIG. 5C, FIG. 5D and FIG. 5E are cross-sectional views showing a method of forming a via hole and a device having the via hole in accordance with embodiments of the present invention.

First, FIG. 5A is a cross-sectional view showing the step of forming a buffer layer, a semiconductor layer, a gate insulating layer, a gate electrode, an interlayer dielectric, and source and drain electrodes on a substrate. As FIG. 5A shows, a buffer layer 202 may be formed on an insulating substrate 201, which may be made of a material such as, for example, plastic or glass.

Next, an amorphous silicon layer may be formed on the buffer layer 202, crystallized to be a polycrystalline silicon layer or a single crystalline silicon layer, and then patterned to form a semiconductor layer 203. In this case, a CVD method or a PVD method may be used to form the amorphous silicon layer.

Next, a gate insulating layer 204 may be formed on the entire surface of the substrate having the semiconductor layer 203, and a material for forming a gate electrode may be formed on the gate insulating layer 204 and then patterned to form a gate electrode 205. After forming the gate electrode 205, impurity ions may be implanted in the semiconductor layer 203, using the gate electrode 205 as a mask, thereby defining source, drain and channel regions in the semiconductor layer 203.

An interlayer dielectric 206 may then be formed on the entire surface of the substrate. In this case, the buffer layer 202, the gate insulating layer 204, and the interlayer dielectric 206 may be formed of, for example, an oxide layer such as a silicon oxide layer or a nitride layer such as a silicon nitride layer.

Next, a double profile contact hole may be formed in the interlayer dielectric 206 and the gate insulating layer 204 using the method described in the first embodiment, or the contact hole may be formed using a typical process. Source and drain electrodes 207 may then be formed, which completes the TFT.

Figure 5B:
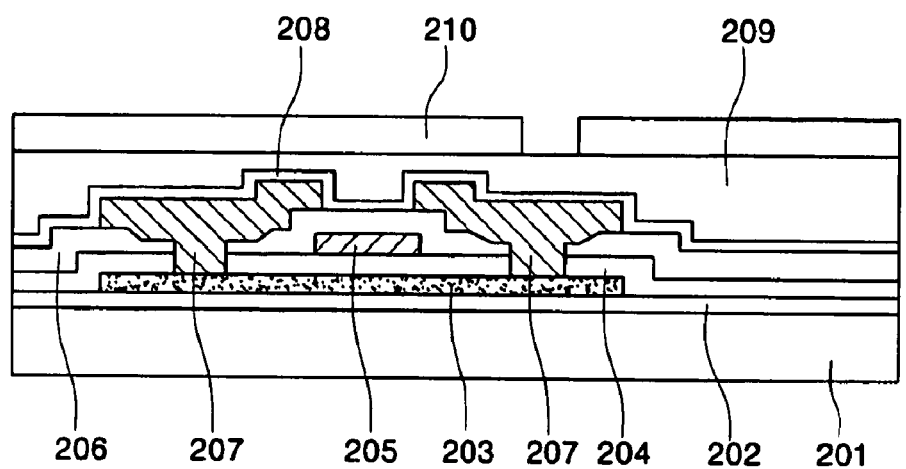

Next, FIG. 5B is a cross-sectional view showing the step of forming a passivation layer and a planarization layer on the TFT. As FIG. 5B shows, a passivation layer 208 and a planarization layer 209 may be sequentially formed on the substrate including the TFT.

Photoresist may be coated on the planarization layer 209, and a photoresist pattern 210 for forming the via hole may be formed by exposure and development processes.

Figure 5C:
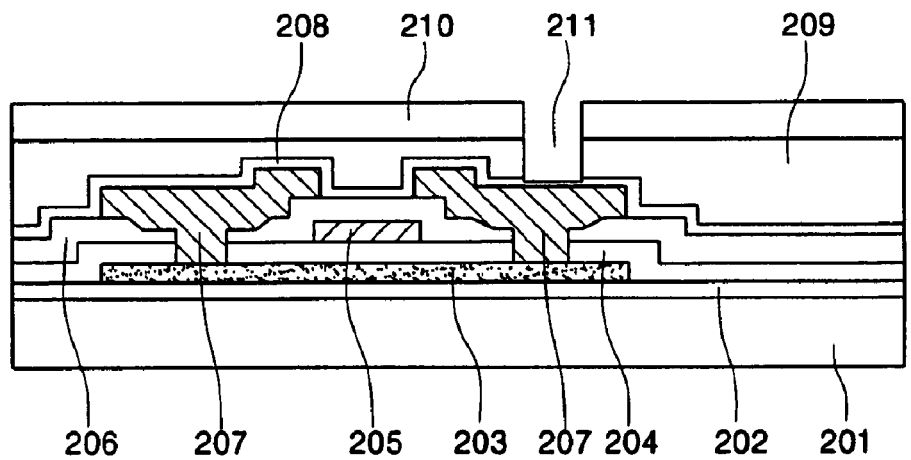

Next, FIG. 5C is a cross-sectional view showing the step of dry etching portions of the passivation layer 208 and the planarization layer 209 using the photoresist pattern 210 as a mask to form the via hole with a predetermined depth. As FIG. 5C shows, portions of the passivation layer 208 and the planarization layer 209 are dry etched at a high etch rate using the photoresist pattern 210 as a mask to thereby form a via hole 211. In this case, the via hole 211 may be formed by penetrating the planarization layer 209 and etching a portion of the passivation layer 208, as shown in FIG. 5C. Alternatively, the via hole 211 may be formed by only penetrating the planarization layer 209 or by etching a portion of the planarization layer 209, as similarly described with regard to FIG. 3C of the first embodiment. Additionally, the dry etching may be carried out by a dry etching process having a low selectivity and a high etch rate.

The via hole 211 may have a taper angle that is nearly perpendicular to adjacent layers. Specifically, the taper angle may be in a range of about 60° to about 90°, preferably in a range of about 75° to about 90°. In this case, the ion etching process or the reactive etching process, as carried out in the first embodiment, may be used for the dry etching.

Figure 5D:
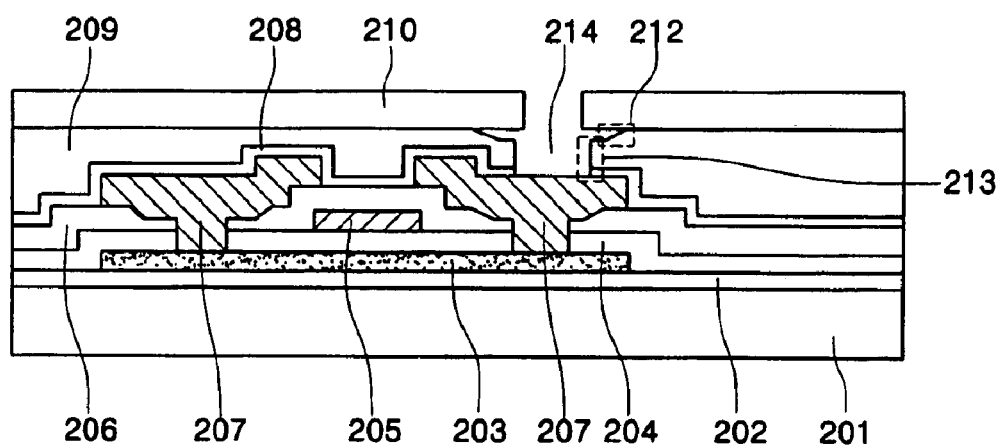

Next, FIG. 5D is a cross-sectional view showing the step of wet etching the via hole having a predetermined depth so as to expose either the source or drain electrode to thereby complete the via hole. As FIG. 5D shows, the via hole 211 etched to a predetermined depth by the dry etching may be wet etched to expose the surface of either the source or drain electrode 207. In this case, the taper angle of the via hole 214 formed by wet etching may be less than that formed by dry etching. Specifically, the taper angle may be in a range of about 5° to about 60°, preferably in a range of about 5° to about 45°. In this case, as described in the first embodiment, the wet etching process may be carried out after removing the photoresist pattern 210.

Additionally, similar to the first embodiment, the planarization layer 209 and the passivation layer 208 may be wet etched using an etching solution having high selectivity against etching the source or drain electrode below, so that the surface of the source or drain electrode is not etched. Furthermore, the wet etching process may remove impurities, such as a polymer, which prevents an increase of contact resistance due to the impurities.

Consequently, a double profile via hole 214, which may be formed by sequential dry and wet etching, penetrates the passivation layer 208 and the planarization layer 209 to expose either the source or drain electrode 207. The double profile via hole 214 has an upper portion with a wet etch profile 212 and a lower portion with a dry etch profile 213.

Figure 5E:
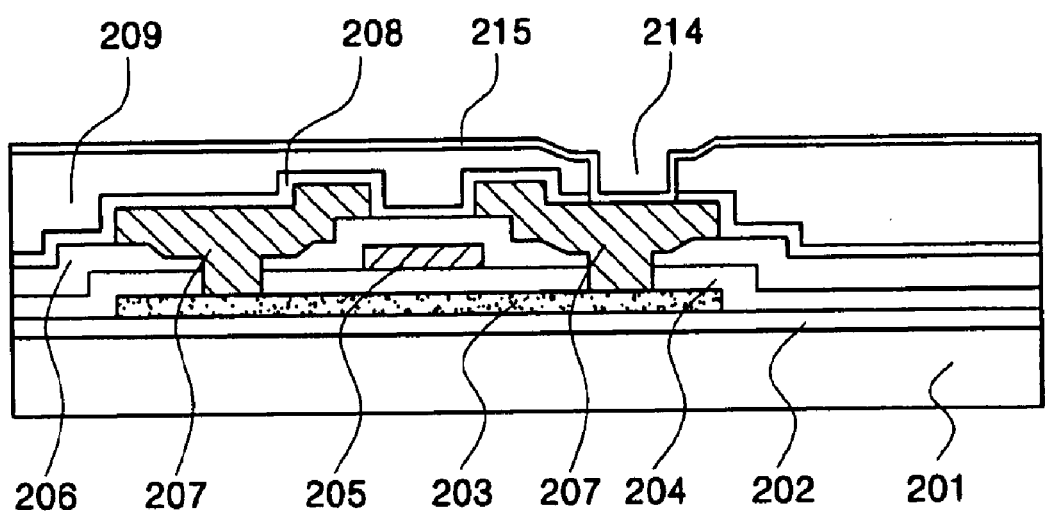

Next, FIG. 5E is a cross-sectional view showing a process of forming a display device having the above-mentioned double profile via hole. As FIG. 5E shows, a device such as a TFT is already formed on the substrate. The double profile via hole 214 may expose either the source or drain electrode, and a transparent electrode, namely, a pixel electrode 215, may be formed on the substrate. Subsequent steps of forming an emission layer and a negative electrode are not shown, however, the emission layer and the negative electrode are formed to thereby form a display device such as an organic EL device.

Depositing the transparent electrode on the planarization layer 209 having the double profile via hole 214 may lead to a more uniformly formed transparent electrode, thereby overcoming the problem where the taper angle of the via hole is too large to uniformly form the transparent electrode.

Fourth Embodiment

FIG. 6A, FIG. 6B, FIG. 6C, FIG. 6D and FIG. 6E are cross-sectional views showing a method of forming a via hole and a device having the via hole in accordance with other embodiments of the present invention.

Figure 6A:
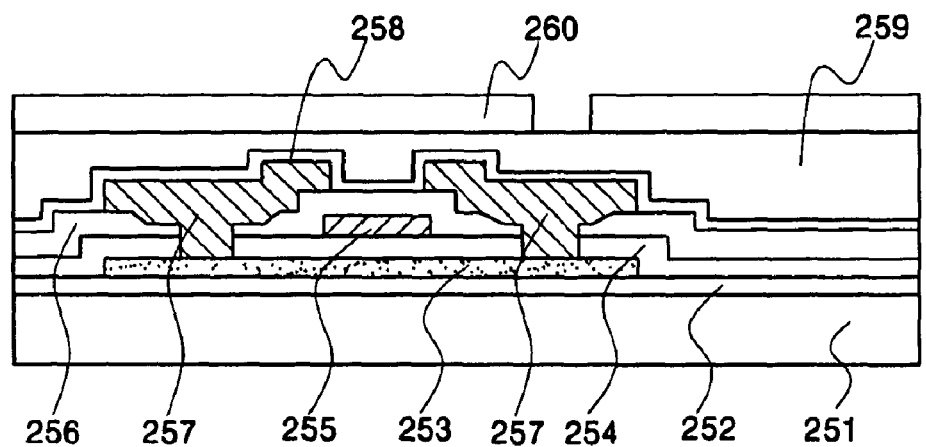
FIG. 6A, FIG. 6B, FIG. 6C, FIG. 6D and FIG. 6E are cross-sectional views showing a method of forming a via hole and a device having the via hole in accordance with embodiments of the present invention.

First, FIG. 6A is a cross-sectional view showing the step of forming a buffer layer, a semiconductor layer, a gate insulating layer, a gate electrode, an interlayer dielectric, source and drain electrodes, a passivation layer, and a planarization layer on a substrate. In this case, the passivation layer may also act as the planarization layer in addition to its own function, so that the planarization layer may be omitted as appropriate. As FIG. 6A shows, a buffer layer 252 may be formed on an insulating substrate 251, which may be made of a material such as, for example, plastic or glass.

Next, an amorphous silicon layer may be formed on the buffer layer 252, crystallized to be a polycrystalline silicon layer or a single crystalline silicon layer, and then patterned to form a semiconductor layer 253. In this case, a CVD method or a PVD method may be used to form the amorphous silicon layer.

Next, a gate insulating layer 254 may be formed on the entire surface of the substrate having the semiconductor layer 253, and a material for forming a gate electrode may be formed on the gate insulating layer 254 and patterned to form a gate electrode 255. After forming the gate electrode 255, impurity ions may be implanted in the semiconductor layer 253, using the gate electrode 255 as a mask, thereby defining source, drain, and channel regions in the semiconductor layer. The buffer layer 252 may be omitted as appropriate.

Next, an interlayer dielectric 256 may then be formed on the entire surface of the substrate. In this case, the buffer layer 252, the gate insulating layer 254, and the interlayer dielectric 256 may be formed of, for example, an oxide layer such as a silicon oxide layer or a nitride layer such as a silicon nitride layer.

Next, a triple profile contact hole may be formed in the interlayer dielectric 256 and the gate insulating layer 254 using the method as described in the second embodiment, or a typical process may be carried out to form the contact hole. Source and drain electrodes 257 may then be formed, which completes the TFT.

A passivation layer 258 and a planarization layer 259 may then be sequentially deposited on the substrate including the TFT.

Photoresist may then be coated on the planarization layer 259, and a photoresist pattern 260 for forming the via hole may be formed by exposure and development processes.

Figure 6B:
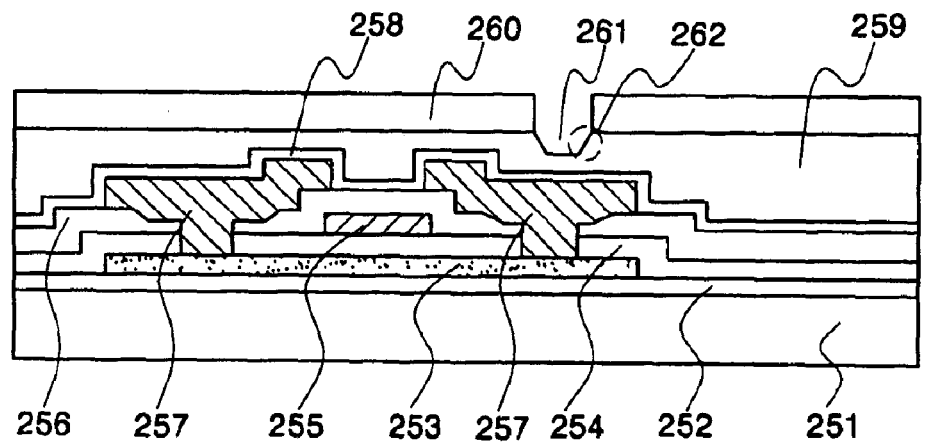

Next, FIG. 6B is a cross-sectional view showing the step of dry etching a portion of the planarization layer at a high etch rate using the photoresist pattern to form a via hole with a first depth. As FIG. 6B shows, the planarization layer 259 may be dry etched at a high etch rate using the photoresist pattern 260 as a mask to thereby form a first via hole 261. In this case, a first depth of the first via hole 261 may be formed in the planarization layer 259 by a depth that the planarization layer is etched, as shown in FIG. 6B. Alternatively, the first via hole 261 may penetrate the planarization layer 259 and a portion of the passivation layer 258 may be etched, similar to region A of FIG. 4C of the second embodiment, or the planarization layer 259 may be penetrated without etching the passivation layer 258. Additionally, the high etch rate dry etching may be carried out by a dry etching process having a low selectivity and a high etch rate.

A taper angle 262 of the first via hole 261 formed by high etch rate dry etching may be in a range of about 30° to about 70°, preferably in a range of about 30° to about 50°. In this case, the ion etching process or the reactive etching process as carried out in the second embodiment may be employed for the dry etch.

Figure 6C:
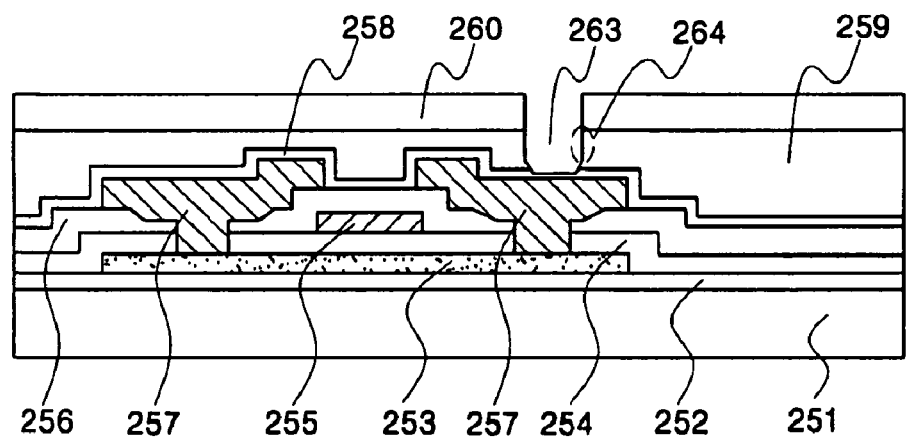

Next, FIG. 6C is a cross-sectional view showing the step of dry etching the first via hole having the first depth with high selectivity to form a second via hole. As FIG. 6C shows, the first via hole 261 etched to the first depth may be further etched by high selectivity dry etching of the planarization layer 259 and the passivation layer 258 with high selectivity against etching the source or drain electrode 257, thereby forming a second via hole 263 having a second depth, which may expose a surface of the either the source or drain electrode, as described in the second embodiment.

In this case, the high selectivity dry etching allows the etch rate for the planarization layer 259 and the passivation layer 258 to be high and that for the source or drain electrode 257 to be low. Consequently, the planarization layer 259 and the passivation layer 258 may be etched by high selectivity dry etching while the source or drain electrode 257 is minimally etched or not etched at all, and a taper angle 264 of the second via hole 263 may be higher than that of the first via hole 261. In other words, the taper angle 264 of the second via hole 263 may be in a range of about 60° to about 90°, preferably in a range of about 70° to about 90°.

Figure 6D:
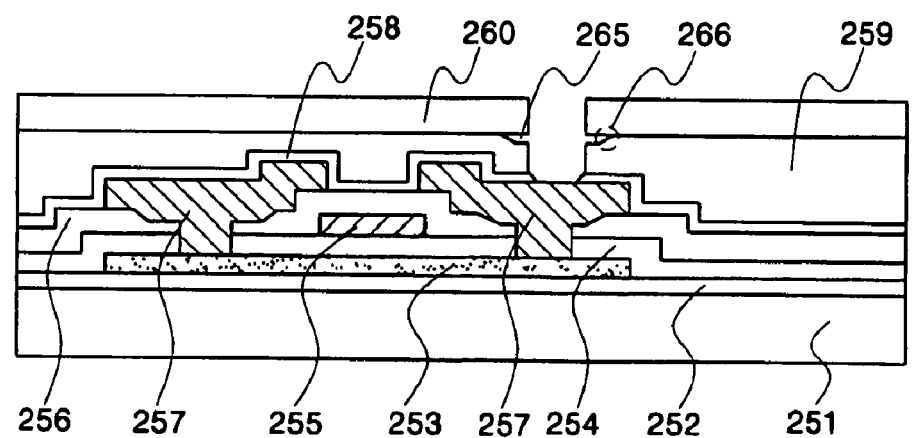

Next, FIG. 6D is a cross-sectional view showing the step of wet etching a region etched to the second depth to form a third via hole. As FIG. 6D shows, the first and second via holes 261 and 263, formed by high etch rate dry etching and high selectivity dry etching, may be wet etched to form a third via hole 265, thereby completing the via holes.

In this case, as shown in FIG. 6D, the photoresist pattern 260 may not be removed, and the first and second via holes 261 and 263 may be wet etched to expose a surface of either the source or drain electrode 257 (or each width of the first and second via holes may be increased when the electrode surface is already exposed) and a low taper angle 266 of the third via hole 265 may be formed by isotropic wet etching. Alternatively, although not shown in FIG. 6D, the photoresist pattern 260 may be removed and a low taper angle of the third via hole 265 may be formed by isotropic wet etching, as similarly described in the second embodiment.

The wet etching may be carried out using a wet etching solution that may not etch the source or drain electrode 257. The etching solution may be used so as to leave no natural oxide layer, impurity or polymer residue on the surface of the source or drain electrode 257 or on side walls of the via holes, so that the surface of the source or drain electrode has no impurities.

In this case, the taper angle 266 of the third via hole 265 formed by wet etching may be in a range of about 5° to about 50°, preferably in a range of about 5° to about 35°. Additionally, the wet etching may be carried out using a wet etching solution such that the planarization layer 259 and the passivation layer 258 are wet etched with a wet etching solution having high selectivity against etching the source or drain electrode 257, so that an exposed surface of the source or drain electrode 257 may not be damaged by the wet etching solution, and polymer residues thereon may also be removed.

As a result, a triple profile via hole including the first, second, and third via holes 261, 263 and 265 is completed, where an upper portion of the triple profile via hole has a wet etch profile, its middle portion has a high selectivity dry etch profile having a high taper angle, and its lower portion has a high etch rate dry etch profile having a low taper angle.

Figure 6E:
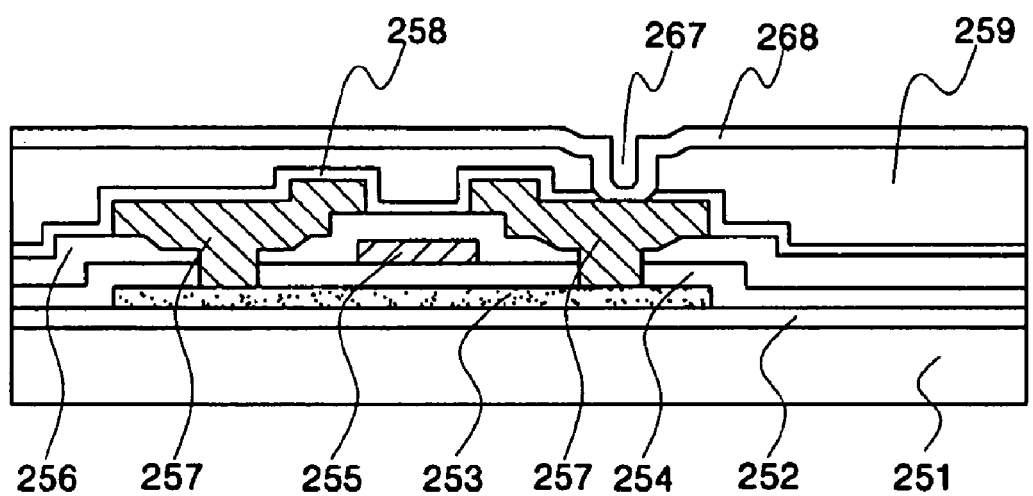

FIG. 6E is a cross-sectional view showing a process of forming a display device having the above-mentioned triple profile via hole. As FIG. 6E shows, a device such as a TFT is already formed on the substrate, a triple profile via hole 267 may expose either the source or drain electrode 257, and a transparent electrode, namely, a pixel electrode 268, may be formed on the substrate. In this case, a contact for electrically connecting the source or drain electrode 257 to the pixel electrode 268 may be formed in the triple profile via hole 267.

Subsequent steps of forming an emission layer and a negative electrode are not shown, however, the emission layer and the negative electrode may be formed to thereby form a display device such as an organic EL device. Depositing the transparent electrode on the planarization layer 259 having the triple profile via hole 267 may lead to a more uniformly formed transparent electrode, thereby overcoming the problem where the taper angle of the via hole is too large to uniformly form the transparent electrode. Further, impurities such as polymer residues may be removed, and an organic EL device may be fabricated in which an exposed surface of the source or drain electrode may not be damaged.

Fifth Embodiment

FIG. 7A, FIG. 7B, FIG. 7C, FIG. 7D and FIG. 7E are cross-sectional views showing a method of forming a via hole and a device having the via hole in accordance with other embodiments of the present invention.

Figure 7A:
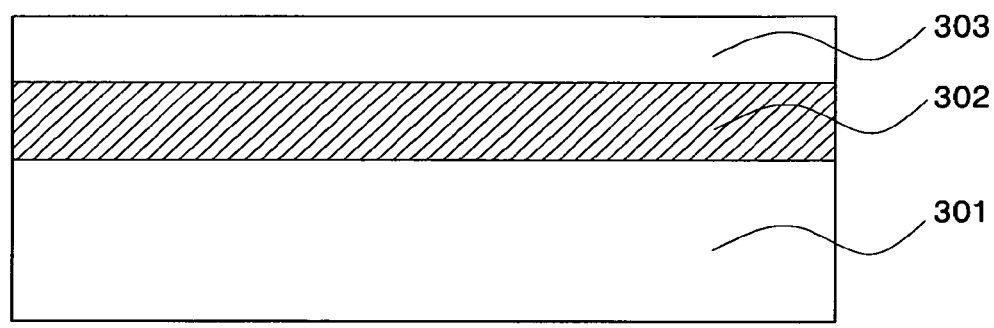
FIG. 7A, FIG. 7B, FIG. 7C, FIG. 7D and FIG. 7E are cross-sectional views showing a method of forming a via hole and a device having the via hole in accordance with embodiments of the present invention.

First, FIG. 7A is a cross-sectional view showing the step of forming a metal interconnection line and an interlayer dielectric on a substrate. As FIG. 7A shows, a metal interconnection line 302 and an interlayer dielectric 303 may be formed on an insulating substrate 301, which may be made of a material such as, for example, plastic or glass. In this case, various devices including a TFT may already be formed or may be formed on the substrate. Additionally, the metal interconnection line 302 delivers electrical signals for driving a display device such as an organic EL device. The interlayer dielectric 303 may be formed of, for example, one silicon oxide layer, one silicon nitride layer, or a stacked layer thereof, and it may be formed by a single process, or it may be formed of insulating layers formed by several processes.

Figure 7B:
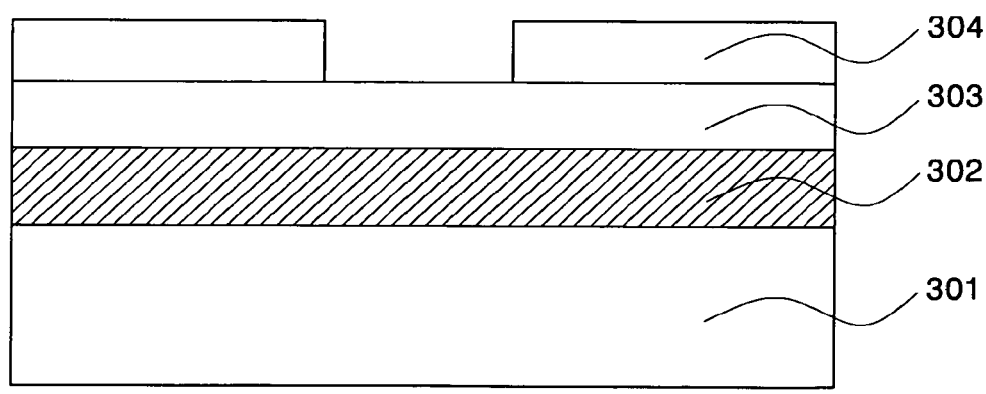

Next, FIG. 7B is a cross-sectional view showing the step of forming a photoresist pattern for forming a via hole on the substrate. As FIG. 7B shows, a photoresist may be coated on the substrate including the interlayer dielectric 303, and a photoresist pattern 304 may be formed by exposure and development processes.

Figure 7C:
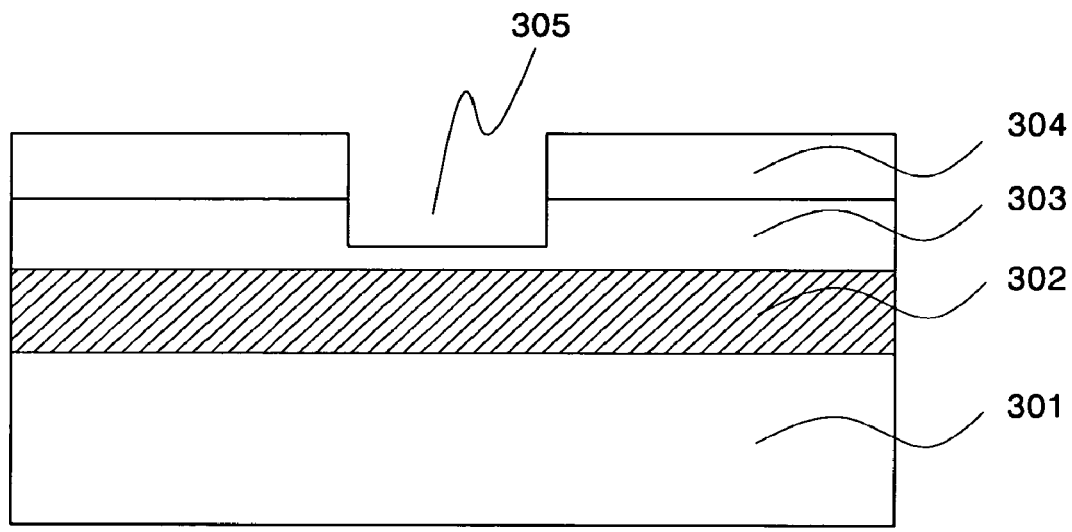

Next, FIG. 7C is a cross-sectional view showing the step of dry etching a portion of the interlayer dielectric using the photoresist pattern to form the via hole with a predetermined depth. As FIG. 7C shows, a portion of the interlayer dielectric 303 may be dry etched using the photoresist pattern 304 as a mask to thereby form a via hole 305. In this case, the interlayer dielectric 303 may be dry etched at a high etch rate so as to allow a taper angle of the via hole 305 to be nearly perpendicular to adjacent layers. Specifically, the taper angle of the via hole 305 may be in a range of about 60° to about 90°, preferably in a range of about 75° to about 90°.

Figure 7D:
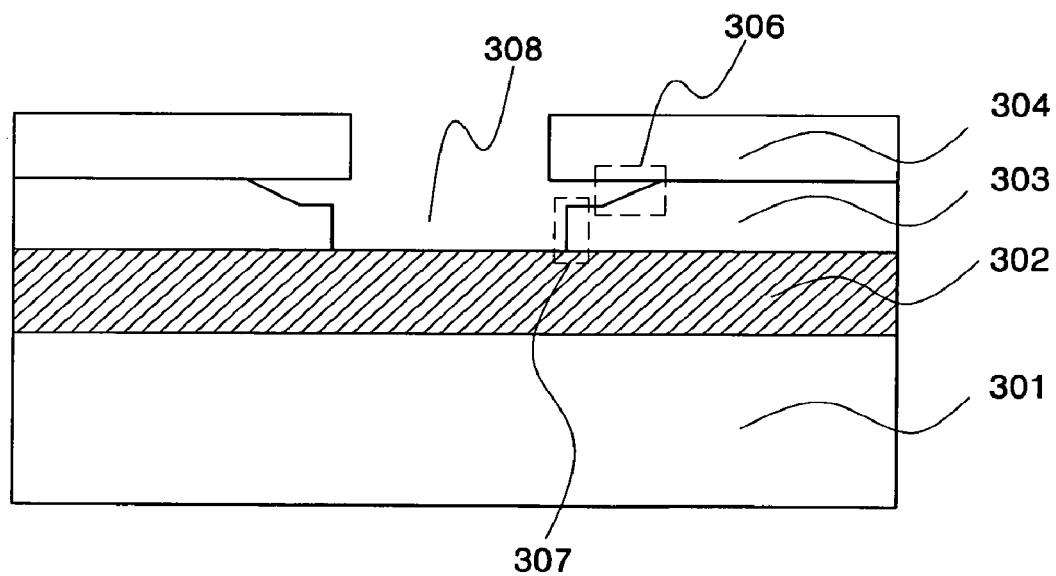

Next, FIG. 7D is a cross-sectional view showing the step of wet etching the via hole having a predetermined depth to expose the metal interconnection line, thereby completing the via hole. As FIG. 7D shows, the interlayer dielectric 303 may be wet etched with an etching solution having high selectivity against etching the metal interconnection line 302 to thereby complete the via hole 308 with a predetermined depth. In this case, the via hole may have a double profile such that an upper portion of the via hole 308 has a wet etch profile 306 and its lower portion has a dry etch profile 307. Alternatively, the photoresist pattern 304 may be removed prior to the wet etching process.

In this case, a taper angle of the via hole 308 may be less than that of the via hole 305 formed by the dry etching. More specifically, the taper angle of the via hole 308 may be in a range of about 5° to about 60°, preferably in a range of about 5° to about 45°.

Additionally, by means of the wet etching, the interlayer dielectric 303 may be etched with high selectivity against etching the metal interconnection line 302, as similarly described in the first embodiment, so that the surface of the metal interconnection line 302 is not etched when etching the interlayer dielectric 303. Furthermore, an impurity such as a polymer may be removed by the wet etching process, thereby preventing the problem of increased contact resistance due to the impurity.

Consequently, the via hole formed by sequentially dry etching and wet etching may penetrate the interlayer dielectric 303 and expose the metal interconnection line 302, and it may have a double profile such that its upper portion has a wet etch profile and its lower portion has a dry etch profile.

Figure 7E:
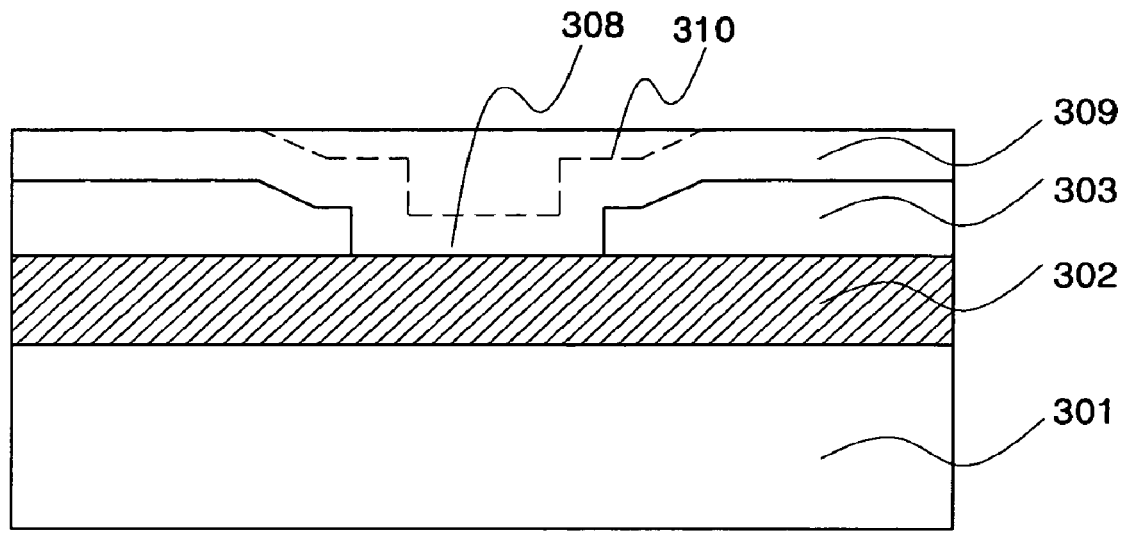

Next, FIG. 7E is a cross-sectional view showing a process of forming a display device having the above-mentioned via hole. As FIG. 7E shows, a metal interconnection line 302 may be formed on a substrate 301, and an interlayer dielectric 303 may be formed on the metal interconnection line 302. Dry etching and wet etching may be sequentially carried out to form a double profile via hole 308, which has an upper portion with a wet etch profile and a lower portion with a dry etch profile, and a conductive material may be deposited and patterned thereon, thereby forming an upper metal interconnection line 309. Alternatively, if necessary, an upper metal interconnection line having a uniform thickness may be formed, as shown by the dotted line 310 of FIG. 7E.

Sixth Embodiment

FIG. 8A, FIG. 8B, FIG. 8C, FIG. 8D and FIG. 8E are cross-sectional views showing a method of forming a via hole and a device having the via hole in accordance with other embodiments of the present invention.

Figure 8A:
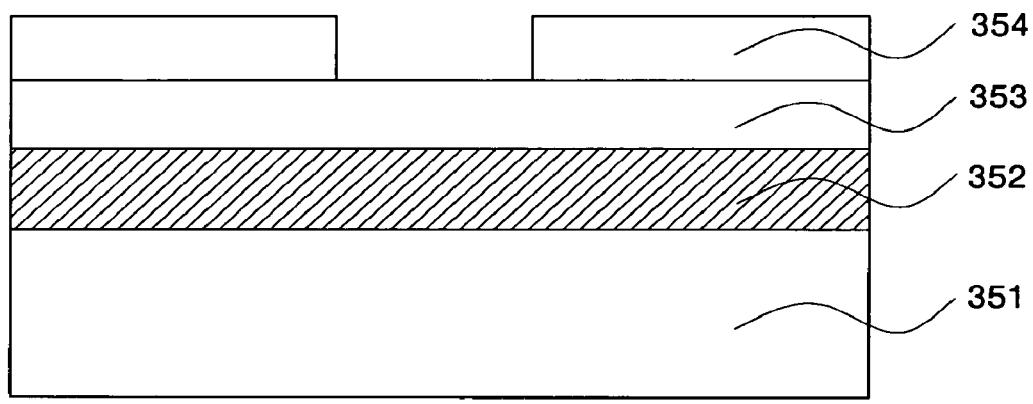
FIG. 8A, FIG. 8B, FIG. 8C, FIG. 8D and FIG. 8E are cross-sectional views showing a method of forming a via hole and a device having the via hole in accordance with embodiments of the present invention.

First, FIG. 8A is a cross-sectional view showing a process of forming a metal interconnection line and an interlayer dielectric on a substrate and forming a photoresist pattern for forming a via hole on the interlayer dielectric. As FIG. 8A shows, a metal interconnection line 352 and an interlayer dielectric 353 may be sequentially formed on an insulating substrate 351 such as plastic or glass, and a photoresist pattern 354 for forming the via hole may be formed on the interlayer dielectric 353.

In this case, a photoresist may be first coated on the substrate, and subsequent exposure and development processes may be carried out to form the photoresist pattern 354.

Figure 8B:
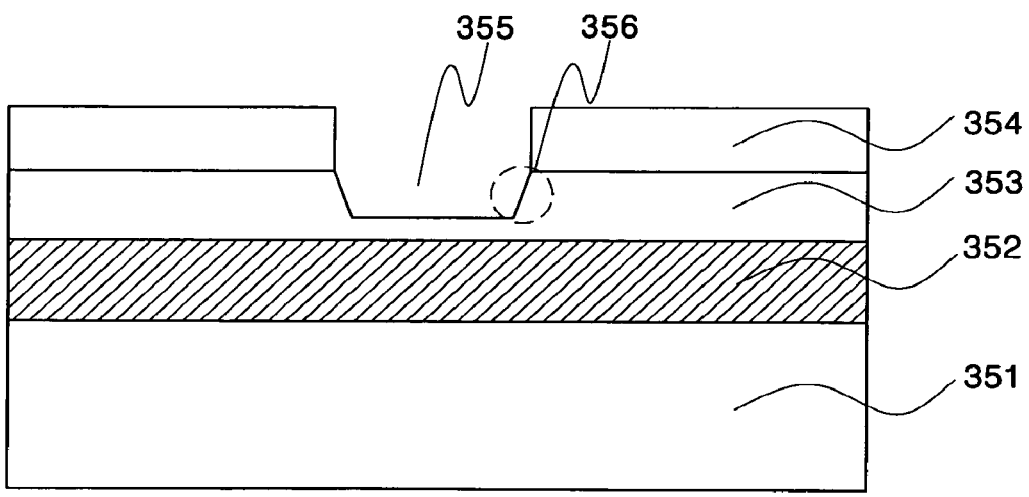

Next, FIG. 8B is a cross-sectional view showing the step of dry etching a portion of the interlayer dielectric at a high etch rate using the photoresist pattern as a mask to form a first via hole with a first depth. As FIG. 8B shows, a portion of the interlayer dielectric 353 may be dry etched at a high etch rate using the photoresist pattern 354 as a mask to thereby form a first via hole 355 with a first depth. In this case, the dry etching may be carried out using a dry etching process having a low selectivity and a high etch rate.

A taper angle 356 of the first via hole 355 may be in a range of about 30° to about 70°, preferably in a range of about 30° to about 50°. In this case, the ion etching process or the reactive etching process as carried out in the second embodiment may be used for the high etch rate dry etching.

Figure 8C:
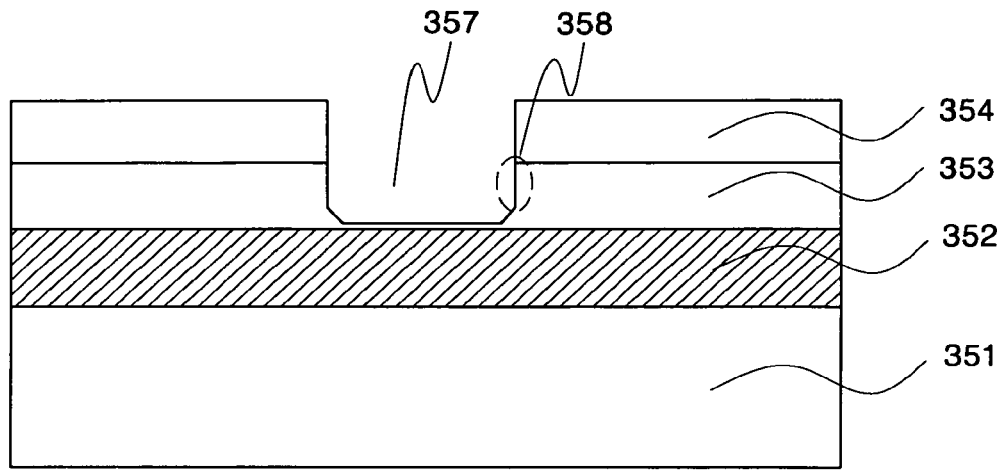

Next, FIG. 8C is a cross-sectional view showing the step of dry etching the first via hole having the first depth with high selectivity to form a second via hole. As FIG. 8C shows, the first via hole 355 etched to the first depth may be further etched to a second depth by high selectivity dry etching to form a second via hole 357 that may or may not expose a surface of the metal interconnection line 352, similar to the method described in the second embodiment. In this case, the high selectivity dry etching allows an etch rate for the interlayer dielectric 353 to be high and that for the metal interconnection line 352 to be low. Consequently, the interlayer dielectric 353 is etched by the high selectivity dry etching while the metal interconnection line 352 is minimally etched, or not etched at all, and a taper angle 358 of the second via hole 357 may be higher than that of the first via hole 355. Specifically, the taper angle 358 of the second via hole 357 may be in a range of about 60° to about 90°, preferably in a range of about 70° to about 90°.

Figure 8D:
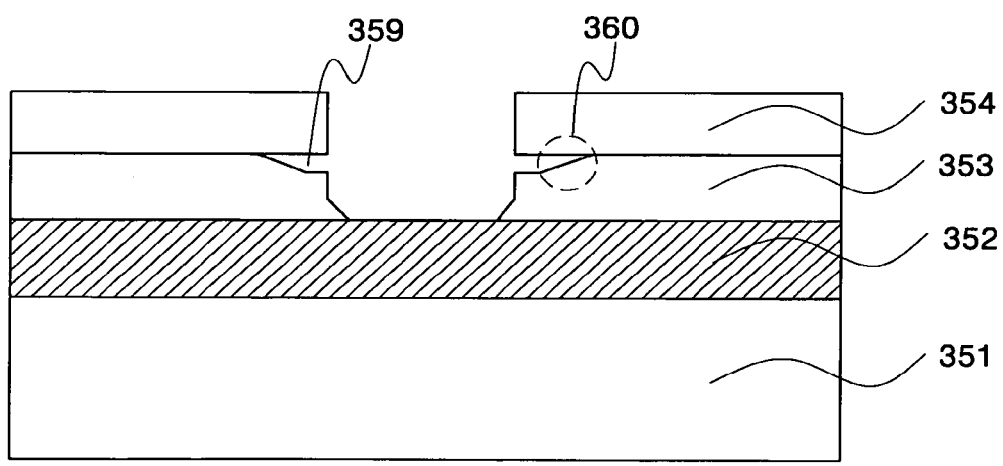

Next, FIG. 8D is a cross-sectional view showing the step of wet etching a region etched to the second depth to form a third via hole. As FIG. 8D shows, the first and second via holes 355 and 357 formed by high etch rate dry etching and high selectivity dry etching, respectively, may be wet etched to form a third via hole 359, thereby completing the via hole.

In this case, the photoresist pattern 354 may not be removed, and the first and second via holes 355 and 357 may be wet etched to expose a surface of the metal interconnection line 352 (or widen the first and second via holes 355 and 357 if the surface is already exposed), and a low taper angle 360 of the third via hole 359 may be formed by isotropic wet etching. Alternatively, although not shown in FIG. 8D, the photoresist pattern 354 may be removed and the low taper angle of the third via hole may be formed by isotropic wet etching, as described in the second embodiment.

The wet etching may be carried out with a wet etching solution that does not etch the metal interconnection line 352. The etching solution may be used to leave no natural oxide layer, impurity, or polymer residues on the surface of the metal interconnection line 352 or sidewalls of the via holes, so that the surface of meal interconnection line may have no impurities.

In this case, the taper angle 360 of the third via hole 359 formed by wet etching may be in a range of about 5° to about 50°, or in a range of about 5° to about 35°. Additionally, the wet etching may be carried out such that the interlayer dielectric 353 is wet etched with a wet etching solution having high selectivity against etching the metal interconnection line 352, so that a surface of the metal interconnection line 352 which may be exposed, or is already exposed, may not be damaged by the wet etching solution.

As a result, a triple profile via hole including the first, second, and third via holes 355, 357 and 359 is completed, where an upper portion of the triple profile via hole has a wet etch profile, its middle portion has a high selectivity dry etch profile having a high taper angle, and its lower portion has a high etch rate dry etch profile having a low taper angle.

Figure 8E:
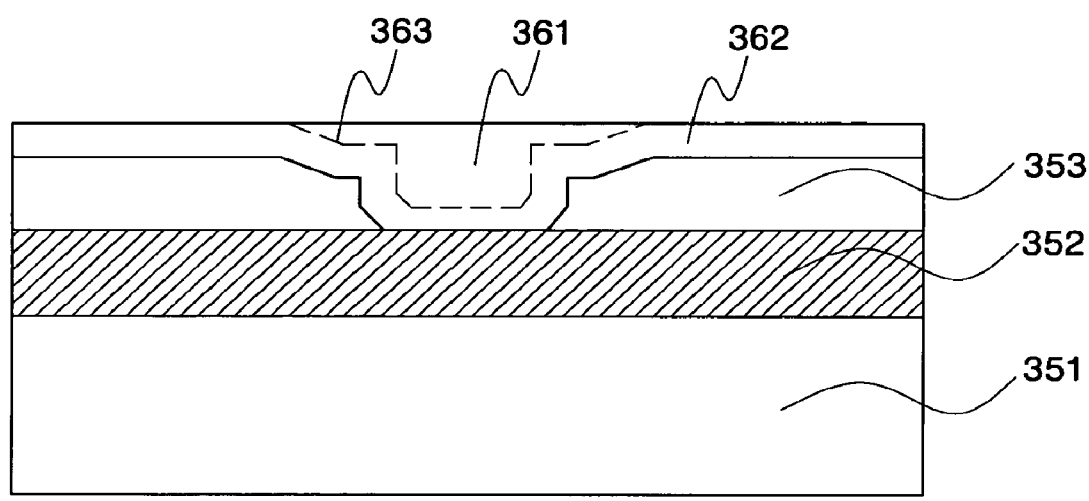

FIG. 8E is a cross-sectional view showing a process of forming a display device having the above-mentioned triple profile via hole. As FIG. 8E shows, the metal interconnection line 352 and the interlayer dielectric 353 may be sequentially formed on the substrate 351, the triple profile via hole 361 may expose a portion of the metal interconnection line 352, and an upper metal interconnection line 362 may be formed on the entire surface of the substrate. Consequently, a contact for electrically connecting the metal interconnection line 352 to the upper metal interconnection line 362 is formed in the triple profile via hole 361.

In this case, high etch rate dry etching, high selectivity dry etching, and wet etching may be sequentially carried out to form the triple profile via hole 361 having an upper portion with a wet etch profile and its lower portion with a dry etch profile, which may lead to formation of the upper metal interconnection line 362, as shown in FIG. 8E. Additionally, an upper metal interconnection line 362 having a uniform thickness may be formed if necessary, as shown by the dotted line 363 of FIG. 8E.

Seventh Embodiment

FIG. 9A, FIG. 9B, FIG. 9C, FIG. 9D and FIG. 9E are cross-sectional views showing a method of forming a via contact hole and a device having the via contact hole in accordance with other embodiments of the present invention.

Figure 9A:
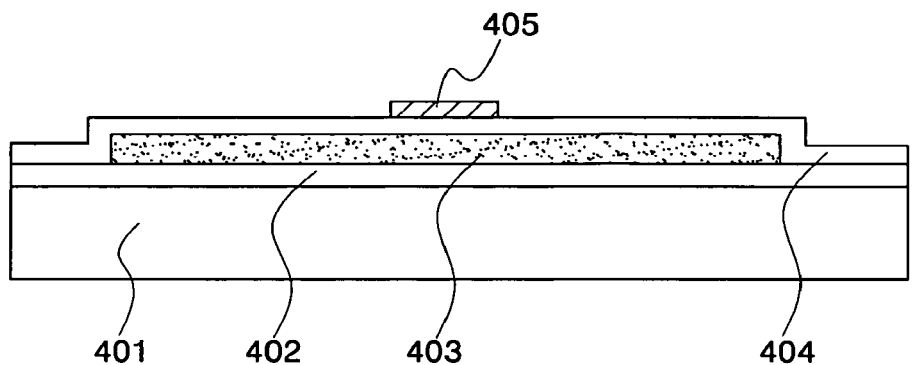
FIG. 9A, FIG. 9B, FIG. 9C, FIG. 9D and FIG. 9E are cross-sectional views showing a method of forming a via contact hole and a device having the via contact hole in accordance with embodiments of the present invention.

First, FIG. 9A is a cross-sectional view showing the step of forming a buffer layer, a semiconductor layer, a gate insulating layer, and a gate electrode on a substrate. As FIG. 9A shows, a buffer layer 402 may be formed on an insulating substrate 401, which may be made of a material such as, for example, plastic or glass. The buffer layer 402 may prevent moisture or impurities from the insulating substrate from diffusing, and it may facilitate crystallization of the semiconductor layer by adjusting a heat transfer speed during crystallization.

Next, an amorphous silicon layer may be formed on the buffer layer 402, crystallized to be a polycrystalline silicon layer or a single crystalline silicon layer, and then patterned to form a semiconductor layer 403. In this case, a CVD method or a PVD method may be used to form the amorphous silicon layer. Additionally, the amorphous silicon layer may be dehydrated to reduce the presence of hydrogen during or after the layer's formation.

Next, a gate insulating layer 404 may be formed on the entire surface of the substrate including the semiconductor layer 403, and a material for forming a gate electrode may be formed on the gate insulating layer 404 and patterned to form a gate electrode 405. After forming the gate electrode 405, impurity ions may be implanted in the semiconductor layer 403 using the gate electrode as a mask, thereby defining source, drain, and channel regions in the semiconductor layer 403.

Figure 9B:
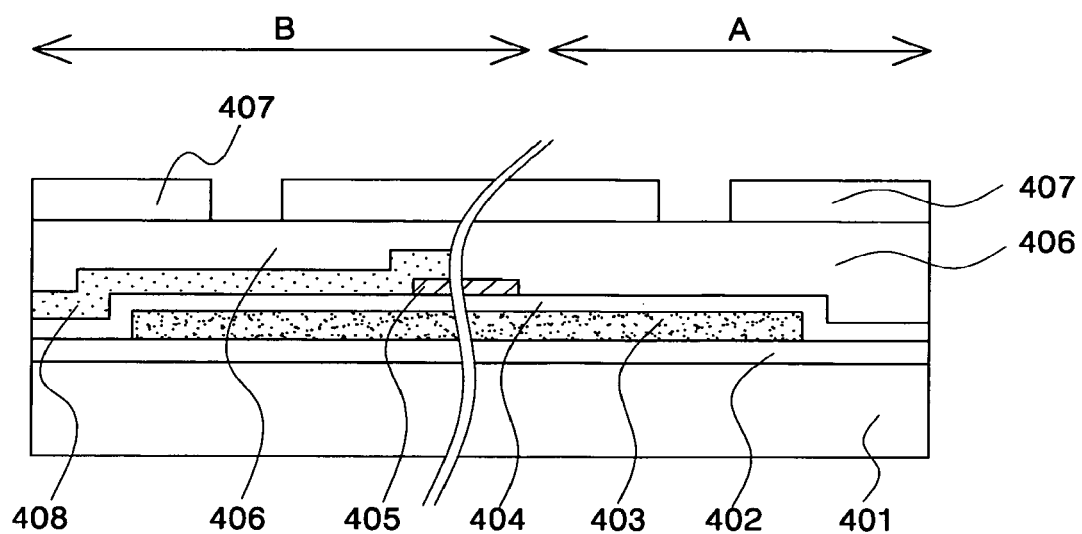

Next, FIG. 9B is a cross-sectional view showing the step of forming a planarization layer and a photoresist pattern on the substrate. As shown in region A of FIG. 9B, a planarization layer 406 may be formed on the substrate, and a photoresist pattern 407 for forming a via contact hole may be formed on the planarization layer 406. Alternatively, as shown in region B of FIG. 9B, an interlayer dielectric 408 may be formed on the substrate before forming the planarization layer 406 and the photoresist pattern 407. In other words, the interlayer dielectric 408 may be included as necessary.

The interlayer dielectric 408 and the planarization layer 406 may be formed of an insulating layer such as, for example, a silicon oxide or silicon nitride layer.

The photoresist pattern 407 may be formed by coating a photoresist on the substrate by a spin method or a spray method. Subsequent exposure and development processes are then carried out.

Figure 9C:
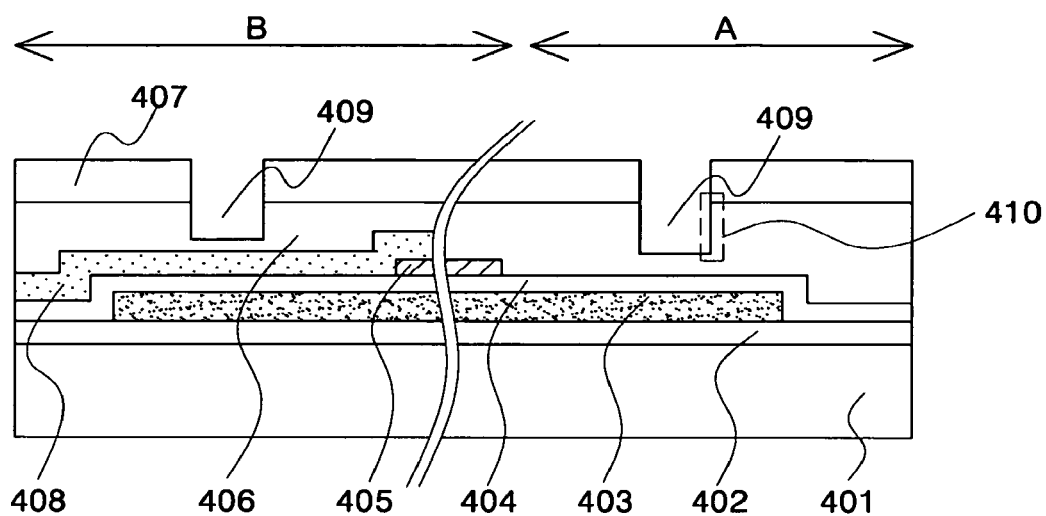

Next, FIG. 9C is a cross-sectional view showing the step of dry etching portions of the planarization layer to form a via contact hole with a predetermined depth. As FIG. 9C shows, the photoresist pattern 407 may dry etched along with the planarization layer 406 in region A and region B to thereby form a via contact hole 409 with a predetermined depth.

Alternatively, the planarization layer 406 may be penetrated without etching the gate insulating layer 404, or the planarization layer 406 may be penetrated and a portion of the gate insulating layer 404 may be etched in region A. Similarly, the planarization layer 406, the interlayer dielectric 408, or the gate insulating layer 404 may be etched by a desired depth using the same method in region B, thereby forming a via contact hole 409.

In other words, the via contact hole 409 may be formed by dry etching allowing a desired etching depth to be etched. Additionally, the dry etching may etch the planarization layer 406 or the gate insulating layer 404, or may etch the planarization layer 406, the interlayer dielectric 408 or the gate insulating layer 404 at a high etch rate, to adjust a taper angle and depth of the via contact hole 409. In this case, a taper angle 410 of the via contact hole 409 may be in a range of about 60° to about 90°, preferably in a range of about 75° to about 90°.

In this case, an ion etching process or a reactive etching process may be used for the dry etching.

Figure 9D:
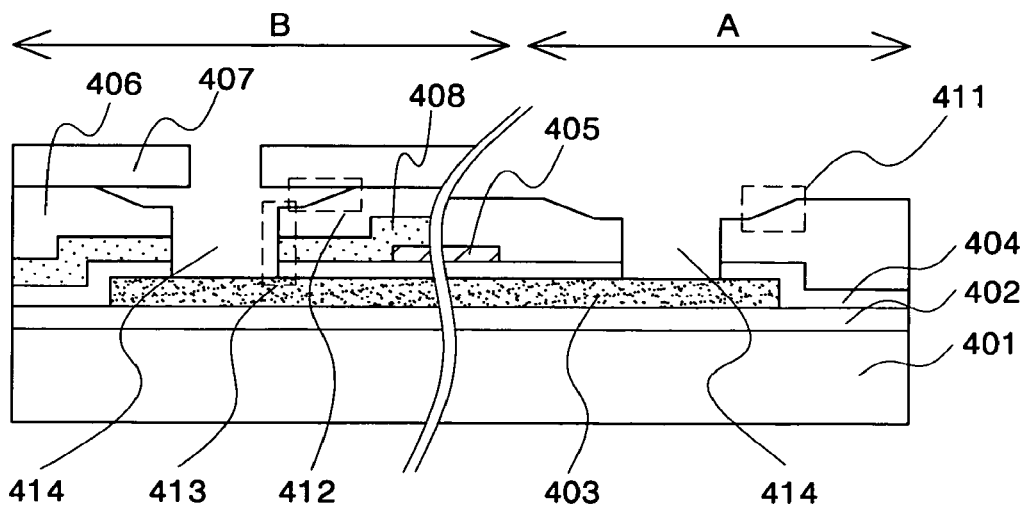

Next, FIG. 9D is a cross-sectional view illustrating the step of wet etching the via contact hole with a predetermined depth to expose a surface of the semiconductor layer, thereby completing the via contact hole. As FIG. 9D shows, the via contact hole 409 with a predetermined depth etched by dry etching may be wet etched to complete the via contact hole and expose the surface of the semiconductor layer 403.

In this case, as shown in region A of FIG. 9D, the photoresist pattern 407 may be removed, the via contact hole 409 formed by dry etching may be wet etched to expose the surface of the semiconductor layer 403, and a low taper angle 411 of the via contact hole 414 may be formed by isotropic wet etching, or as shown in region B of FIG. 9D, the photoresist pattern 407 may not be removed and a low taper angle of the via contact hole 414 may be formed by isotropic wet etching.

In this case, the taper angle 411 of the via contact hole 414 formed by means of wet etching may be in a range of about 5° to about 60°, preferably in a range of about 5° to about 45°. Additionally, the wet etching may be carried out such that the planarization layer and the gate insulating layer or the planarization layer, the interlayer dielectric, and the gate insulating layer are wet etched with an etching solution having high selectivity against etching the semiconductor layer 403, so that the semiconductor layer 403 may not be damaged by the wet etching solution even when the surface of the semiconductor layer is exposed, and polymer residues thereon may also be removed.

As a result, the via contact hole 414 has a double profile where its upper portion has a wet etch profile 412 and its lower portion has a dry etch profile 413.

Figure 9E:
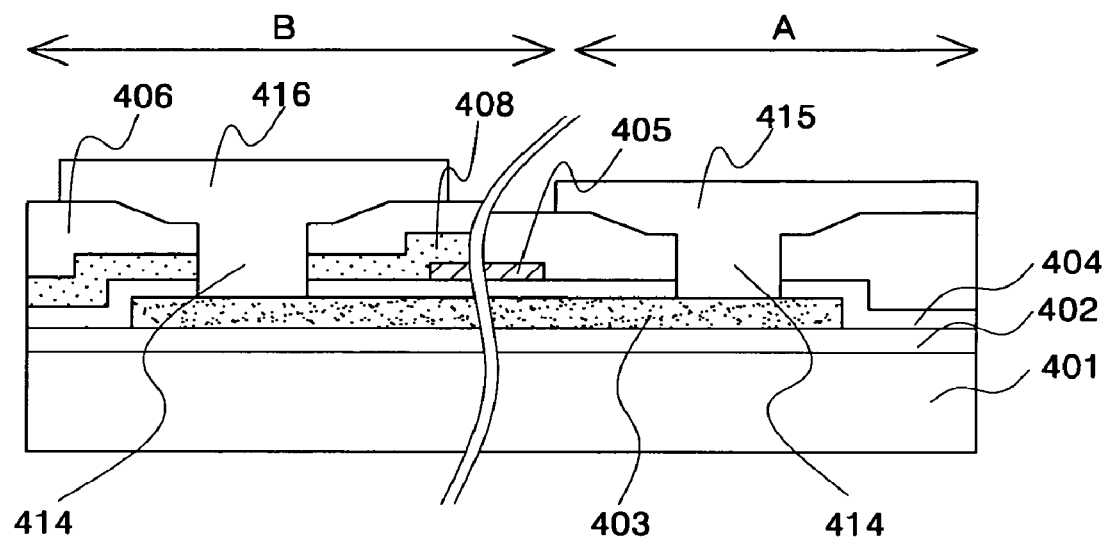

Next, FIG. 9E is a cross-sectional view showing a process of forming a display device or a TFT having the above-mentioned double profile via contact hole. As shown in region A of FIG. 9E, a material for forming a positive electrode may be formed on the entire surface of the substrate including the double profile via contact 414 and then patterned to form a positive electrode 415, which which may contact with the semiconductor layer 403. Although not shown in FIG. 9E, an emission layer and a negative electrode may be subsequently formed to thereby form a display device such as an organic EL device.

Additionally, as shown in region B of FIG. 9E, a material for forming a metal interconnection line may be formed on the entire surface of the substrate and patterned to form a metal interconnection line 416, so that the TFT may have the double profile via contact hole 414 that directly connects the semiconductor layer 403 to the metal interconnection line 416 without requiring a source or drain electrode.

Consequently, the double profile via contact hole 414 has an upper portion with a wet etch profile and a lower portion with a dry etch profile, so that polymer residue may be removed so that it does not cause contact resistance, and the surface of the semiconductor layer 403 may not be damaged. Further, the double profile of the via contact hole facilitates filling the via contact hole 414 with the material for forming the positive electrode or with the material for forming the metal interconnection line.

Eighth Embodiment

FIG. 10A, FIG. 10B, FIG. 10C, FIG. 10D and FIG. 10E are cross-sectional views showing a method of forming a via contact hole and a device having the via contact hole in accordance with other embodiments of the present invention.

Figure 10A:
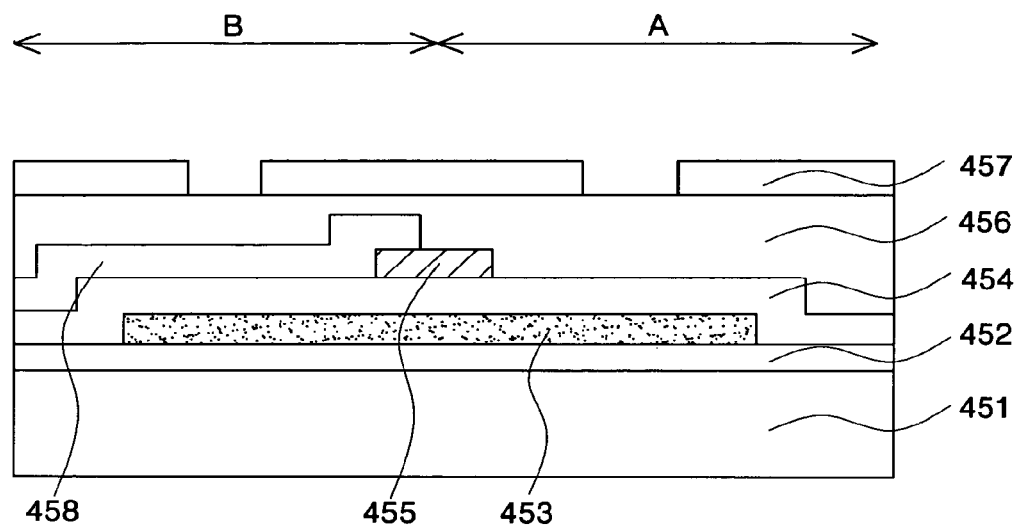
FIG. 10A, FIG. 10B, FIG. 10C, FIG. 10D and FIG. 10E are cross-sectional views showing a method of forming a via contact hole and a device having the via contact hole in accordance with embodiments of the present invention.

First, FIG. 10A is a cross-sectional view showing the step of forming a buffer layer, a semiconductor layer, a gate insulating layer, a gate electrode, an interlayer dielectric, and a photoresist pattern on a substrate. As FIG. 10A shows, a buffer layer 452 may be formed on an insulating substrate 451, such as plastic or glass.

Next, an amorphous silicon layer may be formed on the buffer layer 452, crystallized to be a polycrystalline silicon layer or a single crystalline silicon layer, and then patterned to form a semiconductor layer 453. In this case, a CVD method or a PVD method may be used to form the amorphous silicon layer. Additionally, the amorphous silicon layer may be dehydrated to reduce the presence of hydrogen during or after formation of the amorphous silicon layer.

Next, a gate insulating layer 454 may be formed on the entire surface of the substrate including the semiconductor layer 453, and a material for forming a gate electrode may then be formed on the gate insulating layer 454 and patterned to form a gate electrode 455. After forming the gate electrode 455, impurity ions may be implanted in the semiconductor layer 453 using the gate electrode 455 as a mask, thereby defining source, drain, and channel regions in the semiconductor layer 453.

Next, as shown in region A of FIG. 10A, a planarization layer 456 may be formed on the substrate, and a photoresist pattern 457 for forming a via contact hole may be formed on the planarization layer 456. Alternatively, as shown in region B of FIG. 10A, an interlayer dielectric 458 may be formed on the substrate before forming the planarization layer 456 and the photoresist pattern 457. In other words, the interlayer dielectric 458 may be formed as necessary.

In this case, the interlayer dielectric 458 and the planarization layer 456 may be formed of an insulating layer such as, for example, a silicon oxide or silicon nitride layer.

The photoresist pattern 457 may be formed by coating a photoresist on the substrate using a spin method or a spray method. Subsequent exposure and development processes may then be carried out.

Figure 10B:
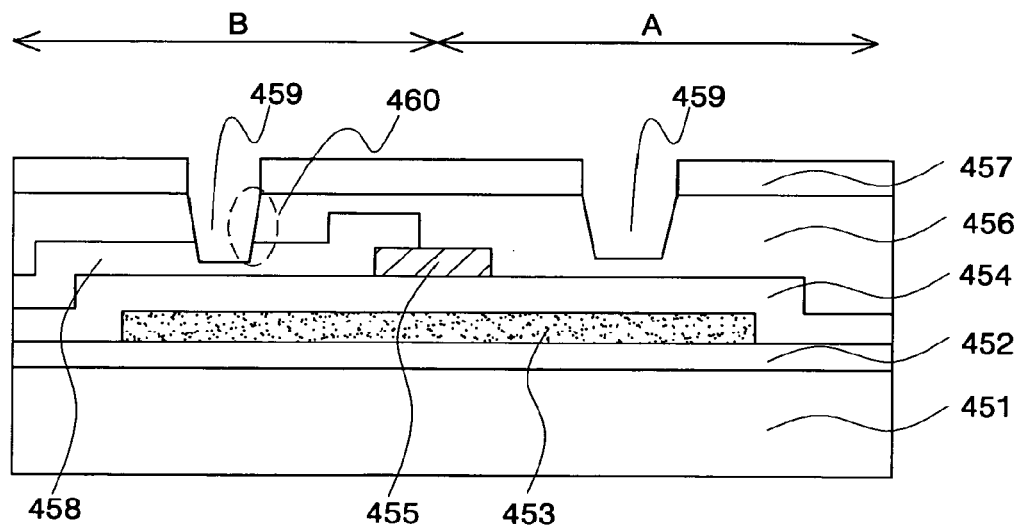

Next, FIG. 10B is a cross-sectional view showing the step of dry etching a portion of the planarization layer at a high etch rate to form a first via contact hole having a first depth. As FIG. 10B shows, using the photoresist pattern 457 as a mask, the planarization layer 456 in region A, or the planarization layer 456 and the interlayer dielectric 458 in region B, may be dry etched to thereby form a first via contact hole 459 with a first depth.

Alternatively, the planarization layer 456 may be penetrated without etching the gate insulating layer 454, or the planarization layer may be penetrated and a portion of the gate insulating layer 454 may be etched in region A. Similarly, the planarization layer 456, the interlayer dielectric 458, or the gate insulating layer 454 may be etched by a desired depth using the same method as that in region A, thereby forming the first via contact hole 459 in region B.

In other words, the first via contact hole 459 may be formed by dry etching allowing a first depth to be etched at a high etch rate. Additionally, the high etch rate dry etching may etch the planarization layer 456 or the gate insulating layer 454, or may etch the planarization layer 456, the interlayer dielectric 458 or the gate insulating layer 454 at a high etch rate, to adjust a taper angle and depth of the first via contact hole 459. In this case, a taper angle 460 of the first via contact hole 459 may be in a range of about 30° to about 70°, preferably in a range of about 30° to about 50°.

In this case, an ion etching process or a reactive etching process may be used for the high etch rate dry etching.

Figure 10C:
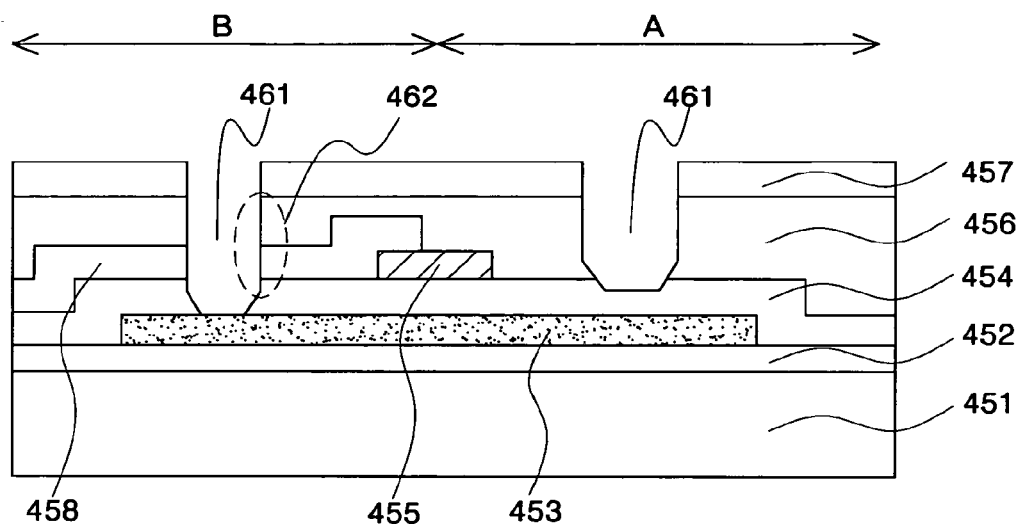

Next, FIG. 10C is a cross-sectional view showing the step of dry etching the first via contact hole having a first depth using high selectivity etching to form a second via contact hole. As FIG. 10C shows, the planarization layer 456 and the gate insulating layer 454 in region A, or the planarization layer 456, the interlayer dielectric 458, and the gate insulating layer 454 in region B, may be dry etched with high selectivity to form a second via contact hole 461 to a second depth, which may or may not expose the semiconductor layer 453.

In this case, the high selectivity dry etching allows an etch rate for the planarization layer 456, the interlayer dielectric 458 and the gate insulating layer 454 to be high and that for the semiconductor layer 453 to be low. As a result, the planarization layer 456, the interlayer dielectric 458, and the gate insulating layer 454 may be etched by the high selectivity dry etching while the semiconductor layer 453 is minimally etched, and a taper angle 462 of the second via contact hole 461 having the second depth formed by high selectivity dry etching may be higher than that of the first via contact hole 459 having the first depth.

In other words, the taper angle 462 of the second via contact hole 461 having the second depth may be nearly perpendicular to adjacent layers. Specifically, it may be in a range of about 60° to about 90°, preferably in a range of about 70° to about 90°.

The second via contact hole 461 having the second depth may be formed to a depth where it does not expose the semiconductor layer 453 as shown in region A of FIG. 10C, or it may be formed to a depth exposing the semiconductor layer 453, as shown in region B of FIG. 10C. This results from the fact that only the gate insulating layer 454 and the interlayer dielectric 458 are etched while the surface of the semiconductor layer 453 is minimally etched by the high selectivity dry etching, so that the surface of the semiconductor layer 453 may be minimally damaged even when the semiconductor layer 453 is exposed as shown in region B. However, since high selectivity dry etching may affect the semiconductor layer 453, the second via contact hole 461 may be etched to a depth that does not expose the semiconductor layer 453, as shown in region A, to prevent it from being damaged or over-etched.

Figure 10D:
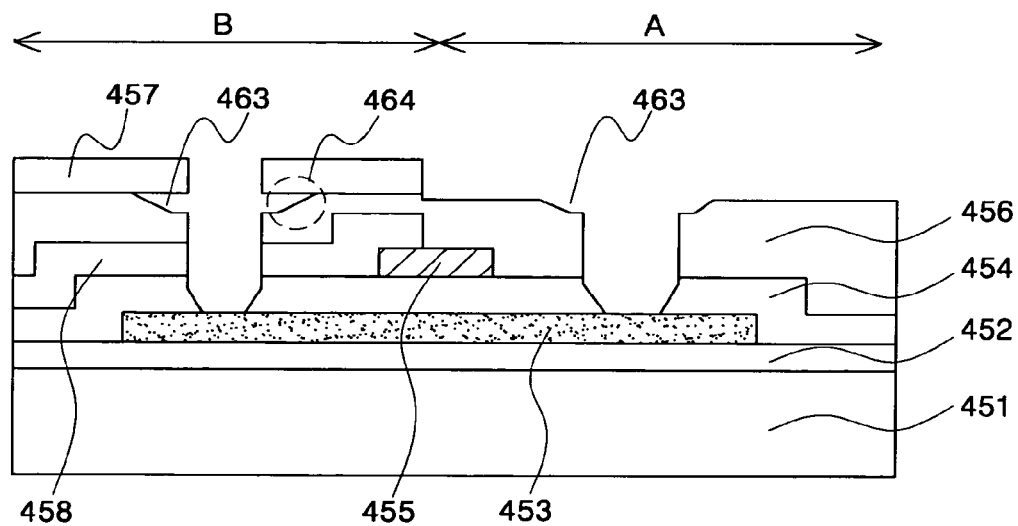

FIG. 10D is a cross-sectional view showing the step of wet etching a region etched to the second depth to form a third via contact hole. As FIG. 10D shows, the second via contact hole 461 dry etched to the second depth may be wet etched to expose the surface of the semiconductor layer 453, thereby forming a third via contact hole 463.

In this case, as shown in region A of FIG. 10D, the photoresist pattern 457 may be removed and the first and second via contact holes 459 and 461 formed by high etch rate dry etching and high selectivity dry etching, respectively, may be wet etched to form a low taper angle 464 of the third via contact hole 463 by isotropic wet etching, thereby exposing the surface of the semiconductor layer 453 (or increasing the widths of the first and second via contact holes when the surface is already exposed). Alternatively, as shown in region B of FIG. 10D, the photoresist pattern 457 may not be removed and a low taper angle of the third via contact hole may be formed by isotropic wet etching.

In this case, the taper angle 464 of the third via contact hole 463 formed by wet etching may be in a range of about 5° to about 50°, however, it may be in a range of about 5° to about 35°. Additionally, the wet etching may be carried out with a wet etching solution such that the planarization layer 456 and the gate insulating layer 454, or the planarization layer 456, the interlayer dielectric 458, and the gate insulating layer 454 are wet etched with high selectivity against etching the semiconductor layer 453, so that the semiconductor layer 453 may not be damaged by the wet etching solution even when the surface of the semiconductor layer is already exposed, and polymer residue thereon may also be removed.

As a result, a triple profile via contact hole including the first, second, and third via contact holes 459, 461 and 463 is completed, where an upper portion of the triple profile via contact hole has a wet etch profile, a middle portion thereof has a high selectivity dry etch profile having a high taper angle, and a lower portion thereof has a high etch rate dry etch profile having a low taper angle.

Figure 10E:
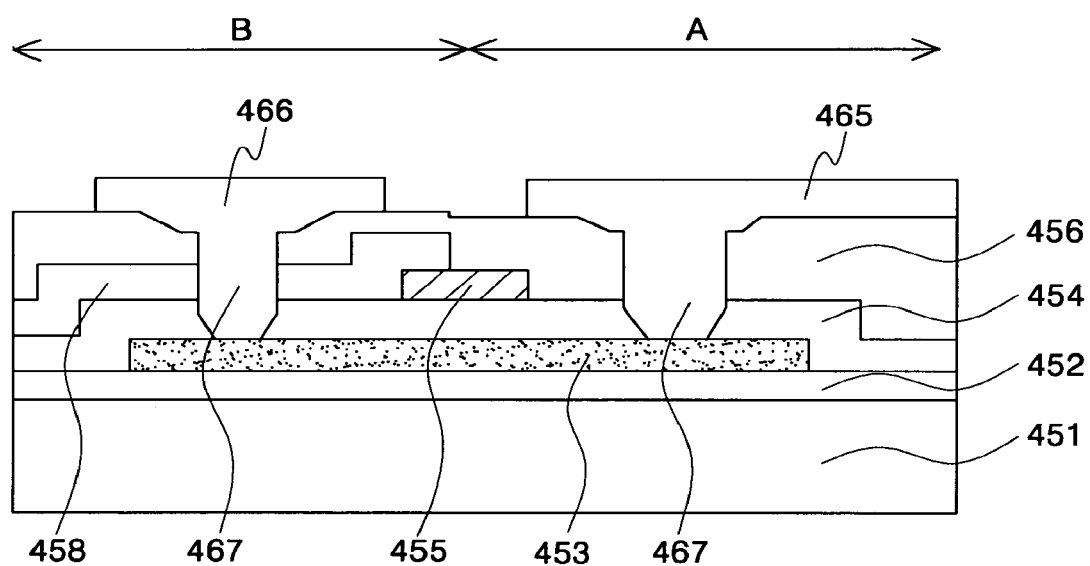

Next, FIG. 10E is a cross-sectional view showing a process of forming a display device or a TFT having the above-mentioned triple profile via contact hole. As shown in region A of FIG. 10E, a material for forming a pixel electrode may be formed on the substrate including the triple profile via contact hole 467, and it may be patterned to form a pixel electrode 465, which may contact the semiconductor layer 453. Although not shown in FIG. 10E, an emission layer and a common electrode may be formed on the pixel electrode 465 to form a display device such as an organic EL device. Additionally, as shown in region B of FIG. 10E, a material for forming a metal interconnection line may be formed on the entire surface of the substrate and patterned to form a metal interconnection line 466, so that the TFT may be fabricated where the triple profile via contact hole 467 directly connects the semiconductor layer 453 with the metal interconnection line 466 without requiring a source or drain electrode.

As a result, the triple profile via contact hole 467 has an upper portion with a wet etch profile, a middle portion with a high selectivity dry etch profile with a high taper angle, and a lower portion with a high etch rate dry etch profile with a low taper angle, so that polymer residue may be removed so that it does not cause contact resistance, and the surface of the semiconductor layer 453 may not be damaged during etching. Further, the via contact hole's triple profile facilitates filling the via contact hole with the material for forming the pixel electrode or with the material for forming the metal interconnection line.

Ninth Embodiment

Figure 11:
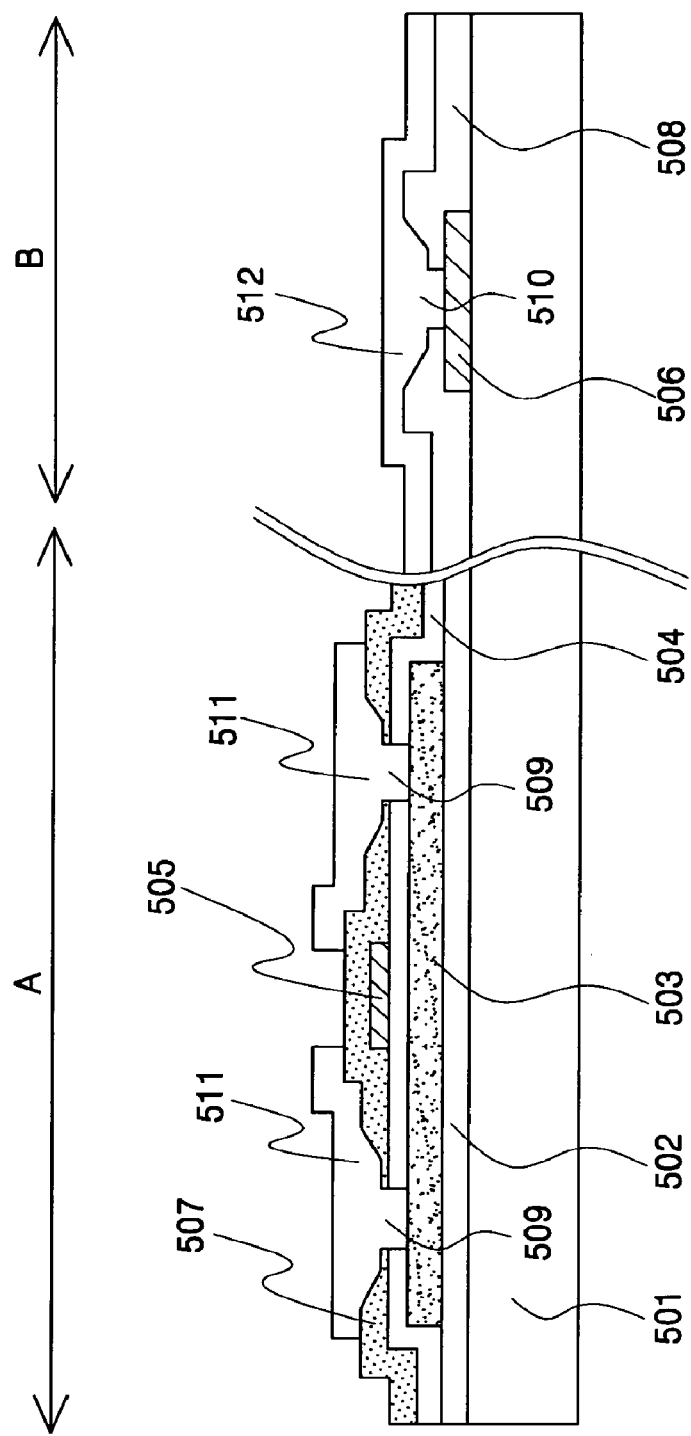
FIG. 11 is a cross-sectional view showing a method of simultaneously forming a contact hole and a via hole, and a device having the contact and via holes in accordance with embodiments of the present invention.

FIG. 11 is a cross-sectional view showing a method of simultaneously forming a contact hole and a via hole, and a semiconductor device having the same in accordance with other embodiments of the present invention.

As FIG. 11 show, region A denotes a TFT in which source and drain electrodes are formed using a double profile contact hole of the first embodiment, and region B denotes a metal interconnection line region in which a metal interconnection line is formed using the double profile via hole of the fifth embodiment. Regions A and B may be simultaneously formed.

Referring to FIG. 11, a buffer layer 502 may be formed on an insulating substrate 501, such as plastic or glass, and a semiconductor layer 503 may be formed in a predetermined region of the substrate, such as region A, using the method as described in the first embodiment. A gate insulating layer 504 may be formed on the substrate, and a material for forming a gate electrode may be formed on the substrate and then patterned to form a gate electrode 505.

In this case, a first metal interconnection line 506 may be formed in region B, which is spaced from region A by a predetermined interval. The first metal interconnection line 506 may be formed using the pattern when patterning the gate electrode material to form the gate electrode 505. In other words, the gate electrode 505 and the first metal interconnection line 506 may be simultaneously formed of the same material. Additionally, layers, which are stacked when the buffer layer 502 and the gate insulating layer 504 are formed in region A, may not be removed from the substrate in region B, even though FIG. 11 shows them as removed.

An interlayer dielectric 507 may then be formed in region A, and an interlayer dielectric 508 may also be formed in region B. Interlayer dielectrics 507 and 508 may be formed simultaneously.

The same methods as those described in the first and fifth embodiments may be employed, so that the interlayer dielectric 507 and the gate insulating layer 504 of region A are dry etched at a high etch rate and wet etched with a selectivity, thereby forming a double profile contact hole 509, and the interlayer dielectric 508 of region B is dry etched at a high etch rate and wet etched with a selectivity, thereby forming a double profile via hole 510. In this case, the dry etching for the regions A and B and the wet etching for the regions A and B may be carried out simultaneously, thereby simultaneously forming the double profile contact hole 509 and the double profile via hole 510. The taper angle of the dry etch profile may be in a range of about 60° to about 90°, preferably in a range of about 75° to about 90°, and the taper angle of the wet etch profile may be in a range of about 5° to about 60°, preferably in a range of about 5° to about 45°.

Next, a material for forming source and drain electrodes may be formed in region A and patterned to form source and drain electrodes 511, and a material for forming a second metal interconnection line may be formed in the region B and patterned to form a second metal interconnection line 512. In this case, the material for forming the source and drain electrodes may be coated on the entire surface of the substrate, and source and drain electrode and second metal interconnection line patterns may be used to simultaneously form the source and drain electrodes 511 and the second metal interconnection line 512. In other words, the source and drain electrodes 511 and the second metal interconnection line 512 may be formed of the same material carrying out one process.

Next, although not shown in FIG. 11, a passivation layer and a planarization layer may be formed on the substrate, and a positive electrode, an emission layer, and a negative electrode may be formed thereon to thereby form a display device such as an organic EL device.

Tenth Embodiment

Figure 12:
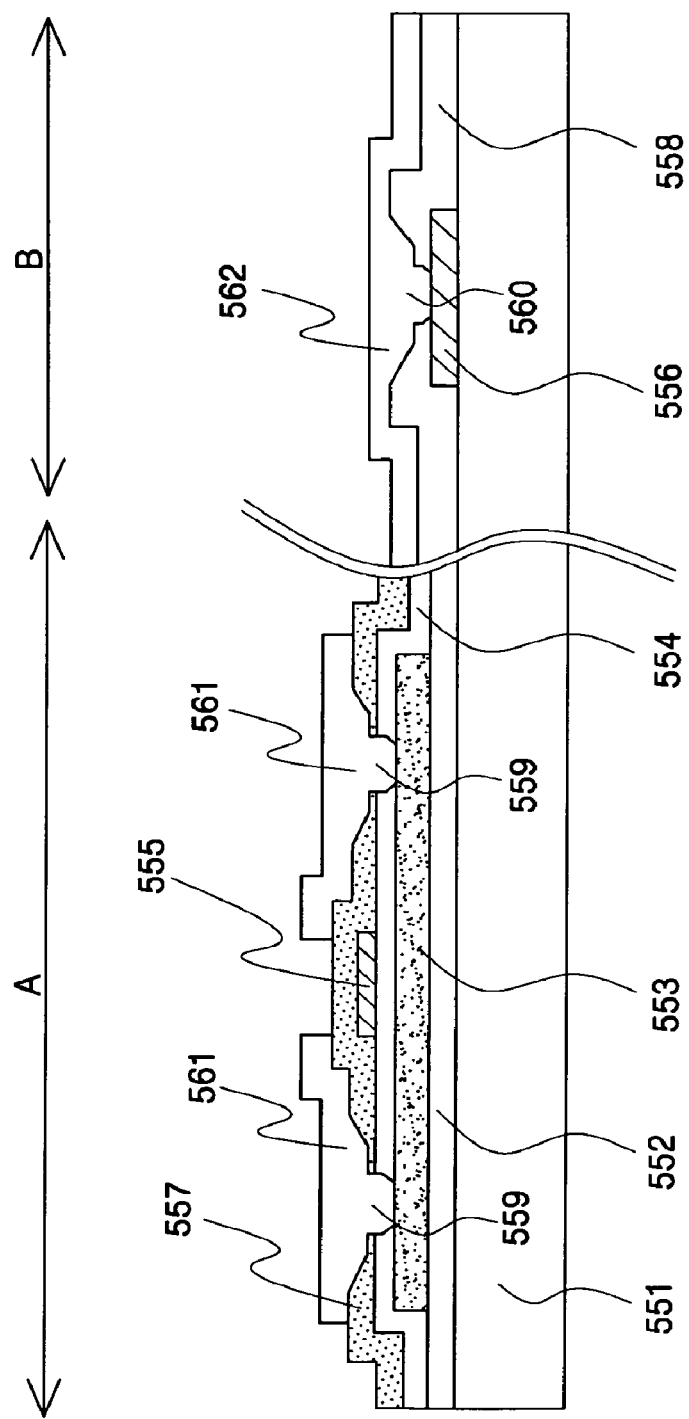
FIG. 12 is a cross-sectional view showing a method of simultaneously forming a contact hole and a via hole, and a device having the contact hole and the via hole in accordance with embodiments of the present invention.

FIG. 12 is a cross-sectional view showing a method of simultaneously forming a contact hole and a via hole, and a device having the contact hole and the via hole in accordance with other embodiments of the present invention. As FIG. 12 shows, region A denotes a TFT in which source and drain electrodes are formed using a triple profile contact hole of the second embodiment, and region B denotes a metal interconnection line region in which a metal interconnection line is formed using a triple profile via hole of the sixth embodiment. Regions A and B may be simultaneously formed.

Referring to FIG. 12, a buffer layer 552 may be formed on an insulating substrate 551, such as plastic or glass, and a semiconductor layer 553 may be formed in a predetermined region of the substrate, such as region A, using the method as described in the first embodiment. A gate insulating layer 554 may be formed on the substrate, and a material for forming a gate electrode may be formed on the substrate and patterned to form a gate electrode 555.

In this case, a first metal interconnection line 556 may be formed in region B, which is spaced from region A by a predetermined interval. The first metal interconnection line 556 may be formed using the pattern when patterning the gate electrode material to form the gate electrode 555. In other words, the gate electrode 555 and the first metal interconnection line 556 may be simultaneously formed of the same material. Additionally, layers, which are stacked when the buffer layer 552 and the gate insulating layer 554 are formed in region A, may not be removed from the substrate in region B, even though FIG. 12 shows them as removed.

An interlayer dielectric 557 may then be formed in region A, and an interlayer dielectric 558 may also be formed in region B. The interlayer dielectrics 557 and 558 may be formed simultaneously.

The same methods as described in the second and sixth embodiments may be employed, so that the interlayer dielectric 557 and the gate insulating layer 554 of region A are etched by means of high etch rate dry etching, high selectivity dry etching, and wet etching with a selectivity, thereby forming a triple profile contact hole 559, and the interlayer dielectric 558 of region B is etched by means of high etch rate dry etching, high selectivity dry etching, and wet etching with a selectivity, thereby forming a triple profile via hole 560. In this case, the high etch rate dry etching and the high selectivity dry etching for regions A and B, and the wet etching for regions A and B, may be carried out simultaneously, so that the triple profile contact hole 559 and the triple profile via hole 560 may be simultaneously formed. The taper angle of the high etch rate dry etch profile may be in a range of about 30° to about 70°, preferably in a range of about 30° to about 50°, the taper angle of the high selectivity dry etch profile may be in a range of about 60° to about 90°, preferably in a range of about 70° to about 90°, and the taper angle of the wet etch profile may be in a range of about 5° to about 50°, preferably in a range of about 5° to about 35°.

Next, a material for forming source and drain electrodes may be formed in region A and then patterned to form source and drain electrodes 561, and a material for forming a second metal interconnection line may be formed in region B and then patterned to form a second metal interconnection line 562. In this case, the material for forming the source and drain electrodes may be coated on the entire surface of the substrate, and source and drain electrode and second metal interconnection line patterns may be used to simultaneously form the source and drain electrodes 561 and the second metal interconnection line 562. In other words, the source and drain electrodes 561 and the second metal interconnection line 562 may be formed of the same materials carrying out one process.

Next, although not shown in FIG. 12, a passivation layer, a planarization layer, and so forth may be formed on the substrate, and a pixel electrode, an emission layer, and a common electrode may also be formed thereon to thereby form a display device such as an organic EL device.

While the embodiments discussed above include double and triple profile contact, via, and via contact holes, it is also possible to form a contact hole, a via hole, or a via contact hole having a quadruple or multiple profile by repeatedly performing wet etching or dry etching. However, a wet etching process may be employed for the final etching process to remove etching residues or impurities, which may form the contact hole, the via hole, or the via contact hole with excellent characteristics.

Accordingly, the semiconductor device and method of fabricating the same in accordance with the present invention may prevent contact non-uniformity and polymer residues from occurring in a contact portion of the contact hole, the via hole, or the via contact hole. Additionally, the surface of the semiconductor layer, the source and drain electrodes, and the metal interconnection line, which are exposed by the contact hole, the via hole, or the via contact hole, may not be damaged.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents

What is claimed is:

1. A semiconductor device, comprising:
   a substrate;
   a thin film transistor formed on the substrate and including a semiconductor layer, a gate insulating layer, a gate electrode, and an interlayer dielectric; and
   a contact hole penetrating the gate insulating layer and the interlayer dielectric and exposing a portion of the semiconductor layer, and having a triple profile in which an upper portion of the contact hole has a wet etch profile, a middle portion of the contact hole has a high selectivity dry etch profile, and a lower portion of the contact hole has a high etch rate dry etch profile and a taper angle in a range of about 30° to about 70°.

2. The semiconductor device of claim 1, wherein the wet etch profile in the upper portion of the contact hole has a taper angle in a range of about 5° to about 50°.

3. The semiconductor device of claim 1, wherein the wet etch profile in the upper portion of the contact hole has a taper angle in a range of about 5° to about 35°.

4. The semiconductor device of claim 1, wherein the high selectivity dry etch profile has a taper angle in a range of about 6020 to about 90°.

5. The semiconductor device of claim 1, wherein the high selectivity dry etch profile has a taper angle in a range of about 70° to about 90°.

6. The semiconductor device of claim 1, wherein the high etch rate dry etch profile has a taper angle in a range of about 30° to about 50°.

7. A semiconductor device, comprising:
a substrate;
a thin film transistor (TFT) formed on the substrate and having a source electrode and a drain electrode;
a passivation layer and a planarization layer formed on the TFT; and
a via hole penetrating the passivation layer and the planarization layer and exposing a portion of either the source electrode and or the drain electrode, and having a triple profile in which an upper portion of the via hole has a wet etch profile, a middle portion of the hole has a high selectivity dry etch profile and a lower portion of the via hole has a high etch rate dry etch profile and a taper angle in a range of about 30° to about 70°.

8. The semiconductor device of claim 7, wherein the wet etch profile in the upper portion of the via hole has a taper angle in a range of about 5° to about 50°.

9. The semiconductor device of claim 7, wherein the wet etch profile in the upper portion of the via hole has a taper angle in a range of about 5° to about 35°.

10. The semiconductor device of claim 7, wherein the high selectivity dry etch profile has a taper angle in a range of about 60° to about 90°.

11. The semiconductor device of claim 7, wherein the high selectivity dry etch profile has a taper angle in a range of about 70° to about 90°.

12. The semiconductor device of claim 7, wherein the high etch rate dry etch profile has a taper angle in a range of about 30° to about 50°.

13. A semiconductor device, comprising:
a substrate;
a semiconductor layer, a gate insulating layer, and a gate electrode formed on the substrate;
a planarization layer formed on the substrate; and
a via contact hole penetrating the planarization layer and the gate insulating layer and exposing a portion of the semiconductor layer, and having a triple profile in which an upper portion of the via contact hole has a wet etch profile, a middle portion of the via contact hole has a high selectivity dry etch profile and a lower portion of the via contact hole has a high etch rate dry etch profile and a taper angle in a range of about 30° to about 70°.

14. The semiconductor device of claim 13, wherein a metal interconnection line or a pixel electrode contacts the exposed portion of the semiconductor layer through the via contact hole.

* * * * *